(12) United States Patent
Hirai et al.

(10) Patent No.: US 7,732,817 B2
(45) Date of Patent: Jun. 8, 2010

(54) PATTERN FORMED STRUCTURE, METHOD OF FORMING PATTERN, DEVICE, ELECTROOPTICAL DEVICE AND ELECTRONIC EQUIPMENT

(75) Inventors: Toshimitsu Hirai, Chino (JP); Toshihiro Ushiyama, Chino (JP)

(73) Assignee: Seiko Epson Corporation, Tokyo (JP)

( * ) Notice: Subject to any disclaimer, the term of this patent is extended or adjusted under 35 U.S.C. 154(b) by 1317 days.

(21) Appl. No.: 11/213,789

(22) Filed: Aug. 30, 2005

(65) Prior Publication Data
US 2006/0065897 A1 Mar. 30, 2006

(51) Int. Cl.
*H01L 29/04* (2006.01)
(52) U.S. Cl. ............... 257/72; 257/4; 257/91; 257/126; 257/175; 257/181; 257/309; 257/401; 257/459; 438/21; 438/39; 438/42; 438/597
(58) Field of Classification Search .......... 257/4, 257/72, 91, 126, 175, 181, 309, 401, 459; 438/21, 39, 42, FOR. 123
See application file for complete search history.

(56) References Cited

U.S. PATENT DOCUMENTS

| 6,445,543 | B1 * | 9/2002 | Gui et al. ............. 360/236.6 |
| 6,946,029 | B2 * | 9/2005 | Tsukuda et al. .......... 117/16 |
| 6,984,576 | B1 * | 1/2006 | Lin et al. .............. 438/611 |
| 7,001,798 | B2 * | 2/2006 | Yamaguchi .............. 438/114 |
| 7,399,687 | B2 * | 7/2008 | Hiramatsu et al. ........ 438/483 |
| 2001/0010391 | A1 * | 8/2001 | Nakajima et al. ........ 257/618 |
| 2003/0003231 | A1 | 1/2003 | Kiguchi et al. |
| 2005/0001282 | A1 * | 1/2005 | Steinberg ............... 257/466 |
| 2005/0003166 | A1 | 1/2005 | Harai |
| 2005/0022374 | A1 | 2/2005 | Harai et al. |
| 2005/0112882 | A1 * | 5/2005 | Unger et al. ............ 438/689 |
| 2005/0245079 | A1 | 11/2005 | Honda et al. |

FOREIGN PATENT DOCUMENTS

| EP | A2-0-930-641 | 7/1999 |
| EP | A2-1-478-016 | 11/2004 |
| JP | A-08-195393 | 7/1996 |
| JP | A-08-213397 | 8/1996 |
| JP | A 11-274671 | 10/1999 |
| JP | A 2000-216330 | 8/2000 |
| JP | A-2004-89878 | 3/2004 |
| JP | A-2005-032835 | 2/2005 |
| JP | A-2005-353772 | 12/2005 |

* cited by examiner

*Primary Examiner*—Thanh V Pham
(74) *Attorney, Agent, or Firm*—Oliff & Berridge, PLC

(57) ABSTRACT

A partition-wall structure having a concave portion corresponding to a pattern formed by a functional liquid, including: a first concave portion provided corresponding to a first pattern; a second concave portion provided corresponding to a second pattern that is coupled to the first pattern and whose width is smaller than a width of the first pattern; and a convex portion provided in the first pattern.

10 Claims, 12 Drawing Sheets

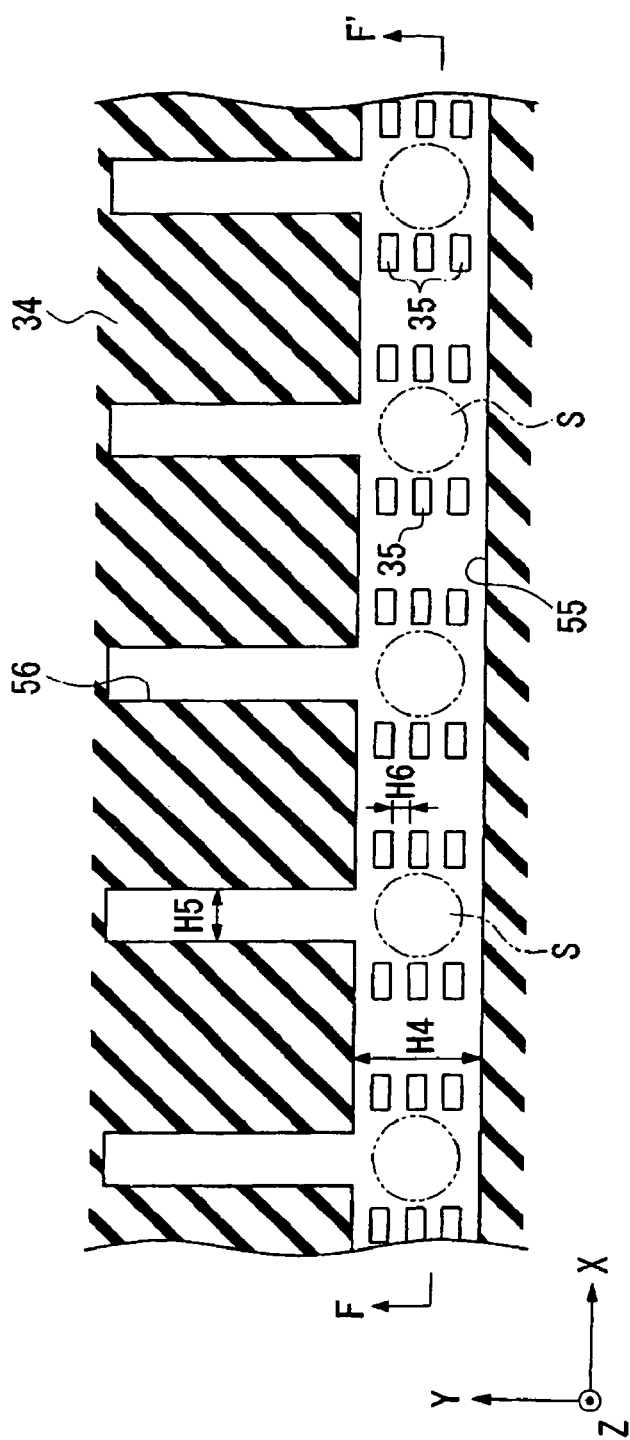
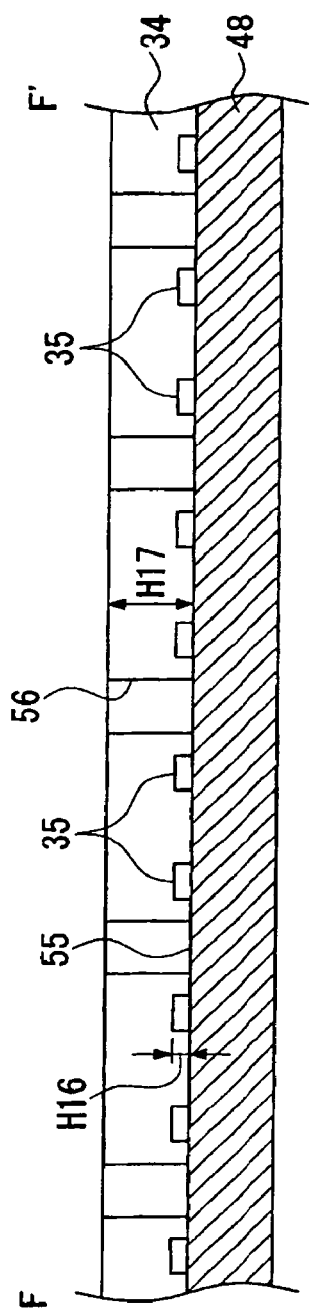

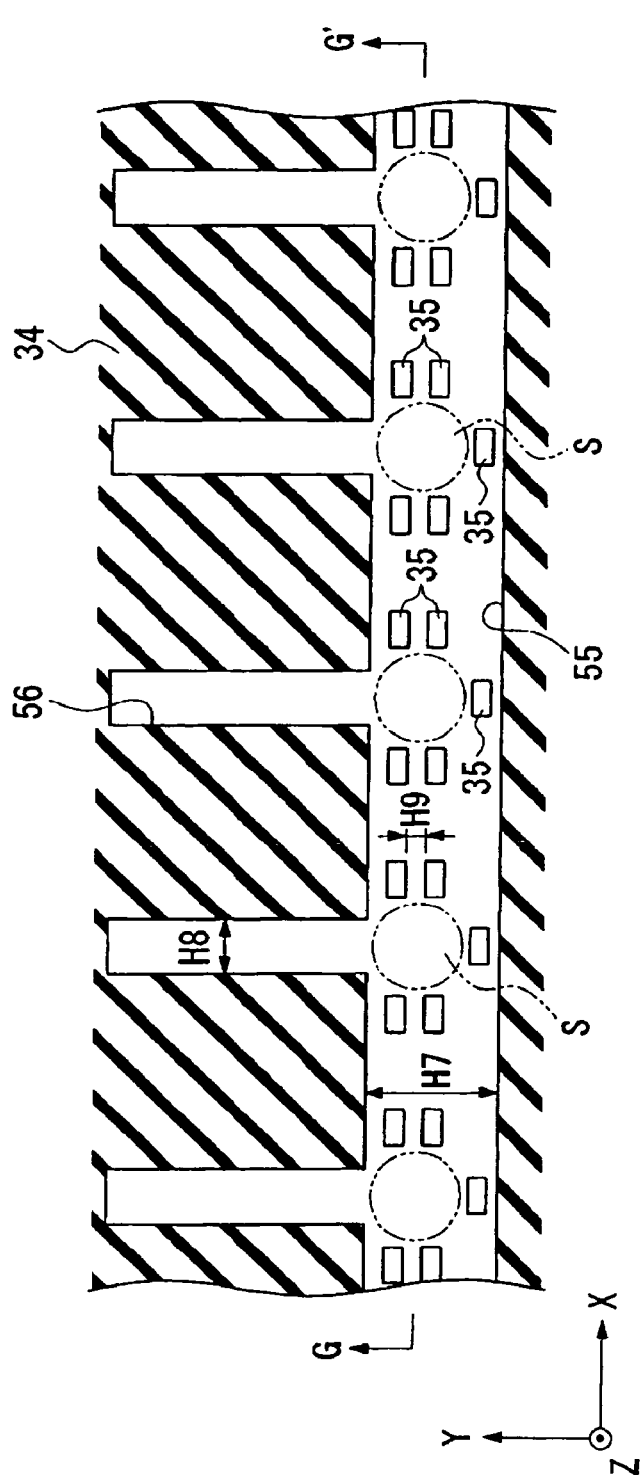
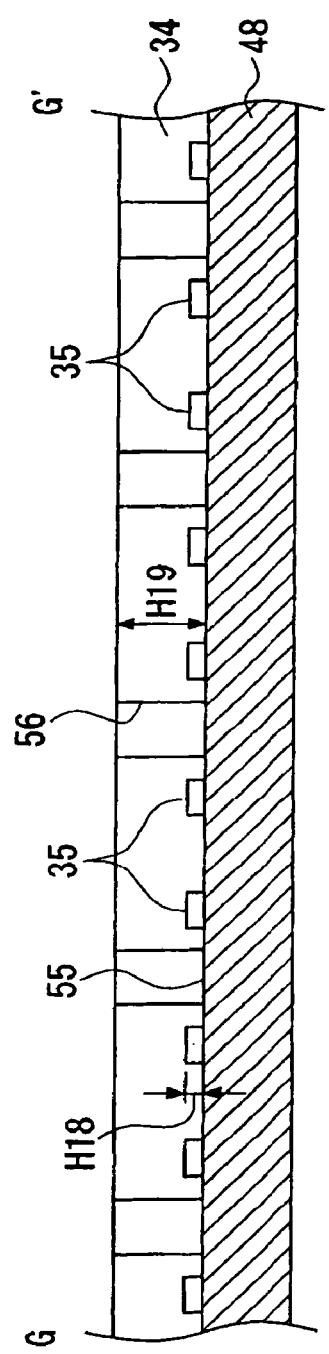
FIG. 9A
FIG. 9B

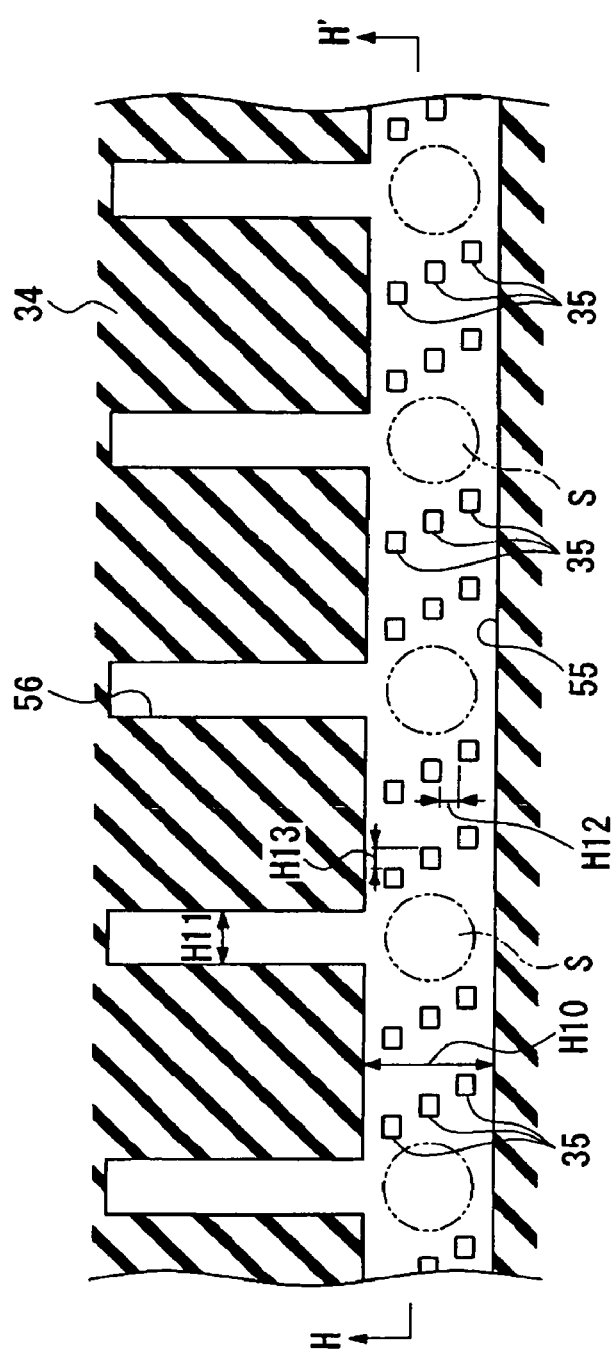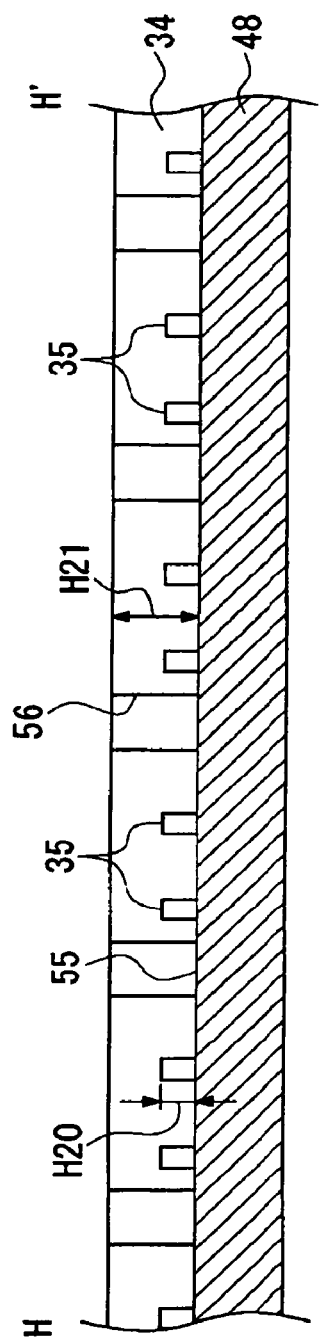
FIG.10A
FIG.10B

PATTERN FORMED STRUCTURE, METHOD OF FORMING PATTERN, DEVICE, ELECTROOPTICAL DEVICE AND ELECTRONIC EQUIPMENT

This application claims the benefit of Japanese Patent Application No. 2004-288696, filed Sep. 30, 2004. The entire disclosure of the prior application is hereby incorporated by reference herein in its entirety.

BACKGROUND OF THE INVENTION

1. Technical Field

The present invention relates to a pattern formed structure, a method of forming a pattern, a device, an electrooptical device and electronic equipment.

2. Related Art

As a method of forming a pattern such as a wiring used for electronic circuits, integrated circuits and the like, for example, photolithography has been widely used. However, the photolithography requires large-scale equipments including vacuum device and exposure device and complicated processes are performed to form the wiring having a predetermined pattern in the equipments. In addition, efficiency in use of the material is only about several % and most of the material has to be disposed, resulting in a high production cost.

Meanwhile, a droplet discharge method in which a liquid material is discharged in the form of droplets from a liquid discharging head has been proposed to form patterns. Japanese Unexamined Patent Publication No. 11-274671 is a first example of related art and Japanese Unexamined Patent Publication No. 2000-216330 is a second example of related art. So-called ink-jet method has been used to form the wiring having a predetermined pattern on a substrate (for example, see the first and second examples). In the ink-jet method, a liquid material for patterning (a functional liquid) is provided in a pattern directly on a substrate, and then heat treatment or laser irradiation is performed to the substrate so as to transform into the pattern. Thereby, this method does not require the photolithography and the processes can be considerably simplified. In addition, according to this method, the material is directly provided on the position of the pattern. Therefore, there is an advantage that the amount of the material which is to be consumed to form the pattern can be reduced.

In recent years, circuits in devices have been highly densified. Accordingly, there is a demand for an extremely-fine and thin wiring. However, it was difficult to stably form such fine pattern by the above-mentioned liquid discharge method because discharged droplets spread out on a substrate after they landed on the substrate. Especially, when the pattern is a conductive layer, a liquid bulge is generated from the above-mentioned spread of the droplets and it could cause defects such as braking of wire and short circuit.

A technique to overcome this problem in the liquid discharge method has been proposed. In the technique, a lyophobic quality is given to a surface of a bank which lays out a forming region of a wiring, the functional liquid is discharged toward the forming region of the wiring, and then the wiring whose width is narrower than the in-flight diameter of the functional liquid discharged by the droplet discharge method is formed. According to this technique, the bank sectioning the wiring forming region is formed. Therefore, even if a part of the functional liquid is discharged on the surface of the bank, all the functional liquid flows into the wiring forming region.

The above-mentioned fine wiring pattern can be formed by utilizing a capillary phenomenon. However, the fine wiring pattern formed by the capillary phenomenon has a relatively thin film thickness compared to other wiring patterns. Thereby, a step, which is a difference in level, is formed on the top face of the fine wiring pattern and the other wiring patterns because of the difference in the film thickness. This could be a problem when another thin film pattern and the like is further formed on the top surface of the bank including the other wiring pattern such that the step could cause disconnection, short circuit and the like.

SUMMARY

An advantage of the present invention is to provide a bank structure in which a flat area is formed on the top surface of an area including the patterns by uniforming the film thickness of the fine pattern and that of the other pattern, a pattern forming method thereof, an electrooptical device and electronic equipment.

According to a first aspect of the invention, a partition-wall structure having a concave portion corresponding to a pattern formed by a functional liquid includes a first concave portion provided corresponding to a first pattern, a second concave portion provided corresponding to a second pattern that is coupled to the first pattern and whose width is smaller than a width of the first pattern and a convex portion provided in the first concave portion.

Here, the width of the first pattern is a length from one end to the other end of the first pattern in a direction orthogonal to the direction in which the first pattern extends. The width of the second pattern is a length from one end to the other end of the second pattern in a direction orthogonal to the direction, which is from the coupling point of the first pattern and the second pattern to the second pattern.

According to the first aspect of the invention, the functional liquid disposed in the first concave portion contacts with the convex portion provided in the first concave portion. The convex portion serves as obstruction and closes off the functional liquid that tends to spread out in the first concave portion. In other words, the convex portion provided on a bottom of the first concave portion controls the flowage of the functional liquid. The functional liquid dammed by the convex portion provided on a bottom of the first concave portion then flows into the second concave portion by the capillary phenomenon. In this way, the inflow of the functional liquid into the second concave portion can be increased and this can equalize the height of the functional liquid provided in the first concave portion with the height of the functional liquid (pattern) provided in the second concave portion. Consequently, the upper surfaces of the functional liquid L disposed in the first concave portion and the second concave portion are leveled and this prevents a wiring and the like formed on the upper surfaces from being broken or short-circuited.

It is preferable that the convex portion is provided on a bottom region of the first concave portion including a coupling region of the first concave portion and the second concave portion.

In this way, the functional liquid closed off by the convex portion can directly flow into the second concave portion because the convex portion is provided in the first concave portion including the region where the first concave portion couples with the second concave portion.

It is also preferable that the convex portion includes a plurality of convex portions and an interval between the adjacent convex portions is smaller than the width of the second pattern.

In this way, the width of the second concave portion becomes wider than the width of the convex portion provided on the bottom of the first concave portion. Thereby, it is possible to make an internal pressure of the second concave portion smaller than an internal pressure of the two adjacent convex portions. Accordingly, the functional liquid disposed on the bottom of the first concave portion can flow into the concave portion where the internal pressure is low. In this way, the capillary phenomenon is promoted and the inflow of the functional liquid into the second concave portion can be increased. This can equalize the height of the functional liquid provided in the first concave portion with the height of the functional liquid provided in the second concave portion.

Furthermore, it is preferable that a height of the convex portion is smaller than a height of an upper surface of the partition-wall structure.

Generally, lyophobicity is given to the upper surface of the partition wall in order to repel the functional liquid discharged thereon. The convex portion formed in the invention can be formed of a part of the partition wall or other material by other process. For example, in a case that the convex portion is formed of a part of the partition wall, when the height of the convex portion is as high as the height of the partition wall, the upper surface of the convex portion becomes lyophobic. Thereby, droplets are repelled on the upper surface of the convex portion and a pattern is not formed in this area because the droplets will not attach to the area. In this way, a sectional area of the pattern decreases and the resistance becomes large when it is used as a conductive pattern. On the contrary, according to the first aspect of the invention, the lyophobic upper surface of the convex portion is removed by development after a halftone exposure, and the height of the convex portion becomes lower than the partition wall. Thereby, the functional liquid can be disposed on the upper surface of the convex portion and the sectional area of the pattern increases. Consequently, it is possible to decrease the resistance of the pattern.

It is also preferable that the convex portion is provided along a longer side of the second pattern.

In this case, when the convex portion is provided in a width direction of the first concave portion, the convex portion is formed along the longer side of the second pattern. Thereby, the obstructing wall which can close off the functional liquid in the width direction of the first concave portion with a small number of the convex portions.

According to a second aspect of the invention, a method of manufacturing a partition-wall structure having concave portions corresponding to a plurality of patterns on a substrate includes a step of applying a partition-wall material on the substrate, a step of forming a partition wall having a first concave portion corresponding to a first pattern and a second concave portion corresponding to a second pattern that is coupled to the first pattern and whose width is smaller than a width of the first pattern and a step of forming a convex portion in the first concave portion.

According to the second aspect of the invention, the functional liquid disposed in the first concave portion contacts with the convex portion provided in the first concave portion. The convex portion serves as obstruction and closes off the functional liquid that tends to spread out in the first concave portion. The functional liquid dammed by the convex portion provided on a bottom of the first concave portion then flows into the second concave portion by the capillary phenomenon. In this way, the inflow of the functional liquid into the second concave portion can be increased and this can equalize the height of the first pattern provided in the first concave portion with the height of the second pattern provided in the second concave portion. Consequently, the upper surfaces of the functional liquid disposed in the first concave portion and the second concave portion are leveled and this prevents a wiring and the like formed on the upper surfaces from being broken or short-circuited.

A device according to a third aspect of the invention includes the above-described partition-wall structure and a pattern placed in the first concave portion and the second concave portion.

According to the third aspect of the invention, a pattern is formed inside the above-mentioned partition-wall structure so that the upper surfaces of the functional liquid disposed in the first concave portion and the second concave portion can be leveled. Therefore, it is possible to provide a device with a fine electric property in which a wiring and the like formed on the upper surfaces is prevented from being broken or short-circuited.

It is preferable that the first pattern is a gate wiring and the second pattern is a gate electrode.

By employing the above-mentioned partition wall structure, a film thickness of the gate wiring can be equalized with a film thickness of the gate electrode. Therefore, a flat area can be formed on the gate wiring, the gate electrode and the partition wall and this can prevent a wiring and the like formed on the upper surfaces from being broken or short-circuited. Consequently, it is possible to realize a device with a fine electric property It is also preferable that the first pattern is a source wiring and the second pattern is a source electrode.

By employing the above-mentioned partition wall structure, a film thickness of the source wiring can be equalized with a film thickness of the source electrode. Therefore, a flat area can be formed on the source wiring, the source electrode and the partition wall and this can prevent a wiring and the like formed on the upper surfaces from being broken or short-circuited. Consequently, it is possible to realize a device with a fine electric property An electrooptical device according to a fourth aspect of the invention includes the above-mentioned device. Furthermore, electronic equipment according to a fifth aspect of the invention includes the above-mentioned electrooptical device.

According to these aspects of the invention, it is possible to provide an electrooptical device and electronic equipment whose quality and performance is improved since they equip with the device having a fine electric property.

In the aspects of the invention, the electrooptical device includes a device having an electrooptical effect in which a refractive index of a material is changed by electric field and a light transmissivity is changed and a device in which electric energy is transformed into light energy. More specifically, such electrooptical device includes a liquid crystal display in which the liquid crystal is used as the electrooptical material, an organic electroluminescence (EL) device in which the organic EL is used as the electrooptical material, an inorganic EL device using the inorganic EL and a plasma display device in which the plasma is used as the electrooptical material, in addition to an electrophoretic display (EPD) device and a field emission display (FED).

BRIEF DESCRIPTION OF THE DRAWINGS

The invention will be described with reference to the accompanying drawings, wherein like numbers refer to like elements, and wherein:

FIG. 8A is a schematic plane view of a bank structure and FIG. 8B is a sectional view of the bank structure;

FIG. 9A is a schematic plane view of a bank structure and FIG. 9B is a sectional view of the bank structure;

FIG. 10A is a schematic plane view of a bank structure and FIG. 10B is a sectional view of the bank structure;

DESCRIPTION OF THE EMBODIMENTS

First Embodiment

The following description will be given by way of example only and it will be appreciated by a person skilled in the art that modifications can be made without departing from the scope of the present invention. In the figures referred in the following description, a scale size may be different in each member or layer in order to make each member or layer recognizable.

(Droplet Discharge Device)

Firstly, a droplet discharge device for forming a wiring pattern in this embodiment is described with reference to FIG. 1.

Figure 1:
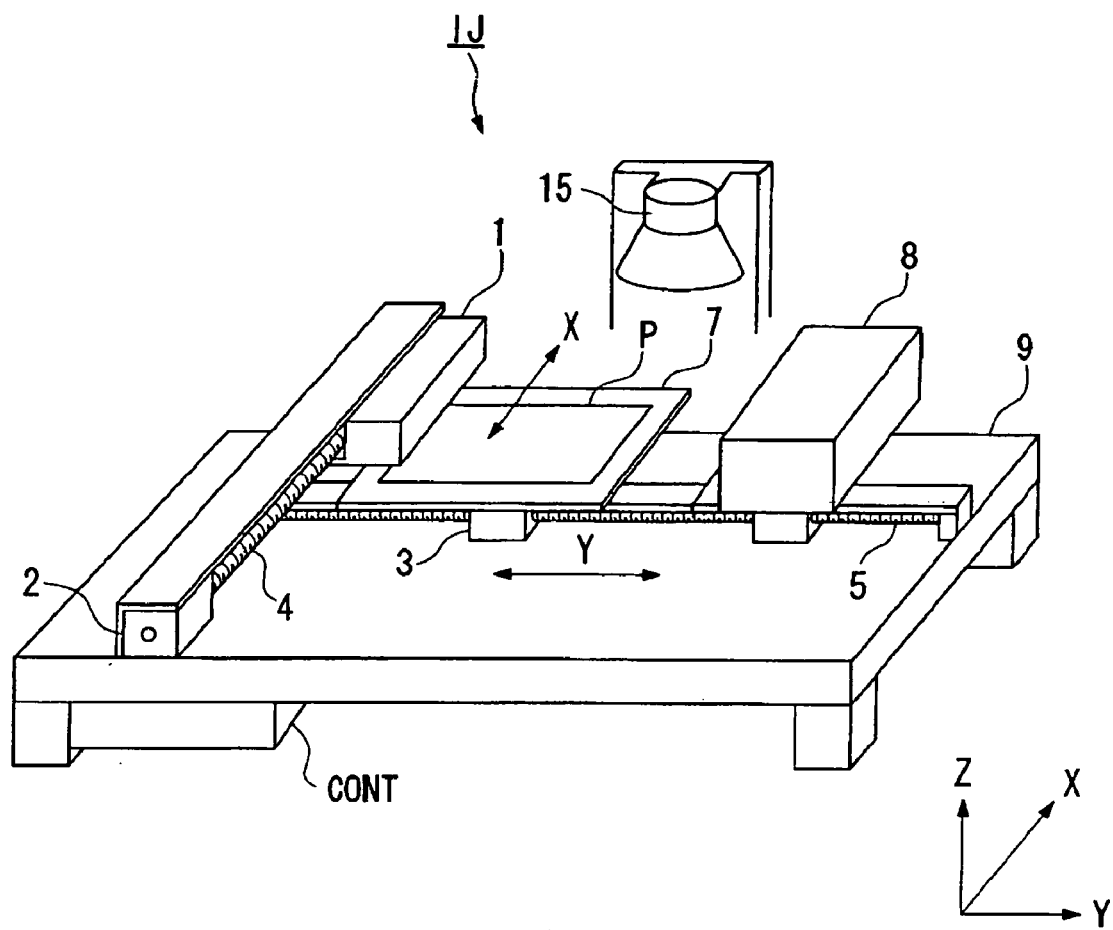
FIG. 1 is a perspective view of a droplet discharge device according to the invention schematically showing its structure.

FIG. 1 is a perspective view of a droplet discharge device, or an ink-jet device (called as IJ hereafter), which arranges a liquid material onto a substrate by the droplet discharge method, as an example of an device used for the pattern forming method of the invention, schematically showing its structure.

The droplet discharge device IJ has a droplet discharge head 1, an X-way drive axis 4, a Y-way guide axis 5, a controller CONT, a stage 7, a cleaning mechanical section 8, a table 9 and a heater 15.

The stage 7 surmounts a substrate P to which ink (liquid material) is discharged by the droplet discharge device IJ. The stage 7 has an unshown feature to fix the substrate P in a reference position.

The droplet discharge head 1 is a multi-nozzle type head that is equipped with a plurality of discharge nozzles. A Y-axis direction corresponds to a longitudinal direction of the droplet discharge head 1. A nozzle is provided in the plural number on a lower face of the droplet discharge head 1. The nozzles align in the Y-axis direction and are provided with a regular space therebetween. From the nozzle of the droplet discharge head 1, the ink containing the above-referred colorant is discharged to the substrate on the stage 7.

An X-way driving motor 2 is coupled to the X-way drive axis 4. The X-way driving motor 2 is a stepping motor and the like, and rotates the X-way drive axis 4 when an X-way driving signal is provided from the controller CONT. When the X-way drive axis 4 is rotated, the droplet discharge head 1 moves in an X-axis direction.

The Y-way guide axis 5 is fixed so as not to move against the table 9. The stage 7 has a Y-way driving motor 3. The Y-way driving motor 3 is a stepping motor and the like. When a Y-way driving signal is provided from the controller CONT, the Y-way driving motor 3 moves the stage 7 in the Y-axis direction.

The controller CONT supplies voltage that controls the discharge of the droplet to the droplet discharge head 1. The controller CONT also supplies a drive pulse signal that controls an X-axis direction movement of the droplet discharge head 1 to the X-way driving motor 2. The controller CONT also supplies a drive pulse signal for controlling a Y-axis direction movement of the stage 7 to the Y-way driving motor 3.

The cleaning mechanical section 8 cleans the droplet discharge head 1. The cleaning mechanical section 8 has an unshown Y-directional driving motor. The cleaning mechanical section 8 is driven by the driving motor and moves along with the Y-way guide axis 5. This movement of the cleaning mechanical section 8 is also controlled by the controller CONT.

The heater 15 is used to perform a heat treatment to the substrate P by lamp anneal. Solvent contained in the liquid material applied to the substrate P will be evaporated and dried with the heater 15. Power on and off of this heater 15 is also controlled by the controller CONT.

The droplet discharge device IJ discharges a droplet to the substrate P as relatively moving the droplet discharge head 1 and the stage 7 that supports the substrate P. Here, the X-axis direction is a scanning direction and the Y-axis direction, which is perpendicular to the X-axis direction, is a non-scanning direction in the following description. Accordingly, the discharge nozzles of the droplet discharge head 1 align in the Y-axis direction or the non-scanning direction with the regular space between two adjacent discharge nozzles. Though the droplet discharge head 1 is placed orthogonal to a traveling direction of the substrate P in FIG. 3, it may be placed so as to cross the traveling direction of the substrate P by adjusting an angle of the droplet discharge head 1. By adjusting the angle of the droplet discharge head 1, a pitch between the nozzles can be changed. Furthermore, a distance between the substrate P and a nozzle face may be discretionally adjusted.

Figure 2:
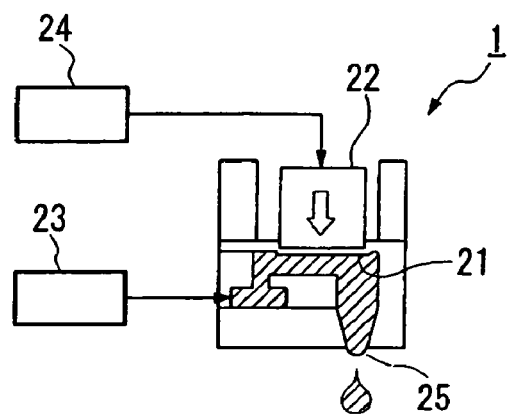
FIG. 2 is a diagram for explaining a mechanism of discharging liquid by a piezo method.

FIG. 2 is an explanatory drawing for explaining a discharging mechanism of the liquid material by a piezo method.

In FIG. 2, a piezo element 22 is provided adjacent to a liquid room 21 in which the liquid material (ink used for the wiring pattern, functional liquid) is kept.

The liquid material is supplied to the liquid room 21 through a liquid material supply system 23 including a material tank that stores the liquid material. The piezo element 22 is coupled to a driving circuit 24. Voltage is applied to the piezo element 22 through the driving circuit 24 and the piezo element 22 is deformed. The liquid room 21 is deformed by the deformation of the piezo element 22 and the liquid material is discharged from a nozzle 25. In this case, a degree of distortion of the piezo element 22 is controlled by changing a value of the applied voltage. A distortion speed of the piezo element 22 is controlled by changing a frequency of the applied voltage.

As for a method of discharging droplets, a bubble method and other hitherto known techniques are adaptable in addition to the above-mentioned piezo method discharging the ink by using the piezoelectric element. In the bubble method, the liquid material is heated so as to make bubbles and the liquid material is discharged by the bubbles. Meanwhile, in the piezo method, the material will not be heated. Therefore, the piezo method has an advantage that composition of the material is hardly affected.

A functional liquid L is a dispersion liquid in which conductive particles dispersed in a dispersion medium or a solution in which organic silver compounds or silver oxide nanoparticles are dispersed in a solvent (dispersion medium). As the conductive particles, for example, metal particles which contain gold, silver, copper, palladium, or nickel, and oxidized substances thereof, a conductive polymer or superconductive particles are used.

To increase the dispersibility of these conductive particles, the surface of the particle may be coated with an organic material. Examples of the coating material to be coated on the surface of the conductive particles include organic solvents such as xylene and toluene, and citric acid and the like.

The diameter of the conductive particle is preferably above 1 nm and below 0.1 μm. When it is larger than 0.1 μm, there is a concern of clogging at the nozzle of the liquid discharge head described later. When it is smaller than 1 μm, the volume ratio of the coating material to the particle becomes large and the ratio of the organic matter which can be obtained in the film to become excessive.

The dispersion medium is not particularly limited as long as it can disperse the above-mentioned conductive particles therein without condensation. For example, the examples include, in addition to water, alcohol such as methanol, ethanol, propanol and butanol, hydrocarbon compounds such as n-heptane, n-octane, decane, decane, dodecane, tetradecane, toluene, xylene, cymene, dulene, indent, dipentene, tetrahydronaphthalene, decahydronaphthalene and cyclohexylbenzene, ether compounds such as ethyleneglycoldimethyl ether, ethyleneglycoldiethyl ether, ethyleneglycolmethylethyl ether, diethyleneglycoldimethyl ether, diethylenglycoldiethyl ether, diethyleneglycolmethylethyl ether, 1,2-dimethoxyethane, bis (2-methoxyethyl)ether, and p-dioxane, and polar compounds such as propylene carbonate, [gamma]-butyrolactone, N-methyl-2-pyrolidone, dimethylformamide, dimethylsulfoxide and cyclohexanone. Among these, water, alcohol, hydrocarbon compounds and ether compounds are preferable in terms of the dispersibility of the particles, stability of the dispersion liquid, and easy application to the droplet discharge method (inkjet method). Water and hydrocarbon compounds are especially preferable as the dispersion medium.

It is preferable that the surface tension of the dispersion liquid of the above-mentioned conductive particles is in the range of 0.02 N/m to 0.07 N/m. This is because when liquid is discharged by the droplet discharge method, if the surface tension is less than 0.02 N/m, the wettability of the ink composition with respect to the nozzle surface increases so that the discharge direction tends to deviate. If the surface tension exceeds 0.07 N/m, the shape of the meniscus at the tip of the nozzle becomes unstable, making it difficult to control the discharge amount and the discharge timing. A good way to adjust the surface tension is to add a small amount of a surface tension modifier such as a fluorine group, silicon group, nonionic group, into the above-mentioned dispersion liquid to an extent not to largely decrease the contact angle with the substrate. The nonionic surface tension modifier increases the wettability of the liquid on the substrate, improves the leveling property of the film, and helps to prevent the occurrence of minute ruggedness on the film. The above-mentioned surface tension modifier may contain organic compounds such as alcohol, ether, ester, ketone, and the like according to need.

The viscosity of the above-mentioned dispersion liquid is preferably above 1 mPa·s and below 50 mPa·s. This is because when liquid material is discharged in the droplet form by the droplet discharge method, if the viscosity is smaller than 1 mPa·s, the area around the nozzle is easily contaminated by discharged ink. If the viscosity is higher than 50 mPa·s, the frequency of clogging occurring at the nozzle hole increases, making it difficult to smoothly discharge droplets.

(Bank Structure)

Next, a bank structure on which the functional liquid (ink) is provided according to this embodiment is described with reference to FIGS. 3A and 3B.

Figure 3A:
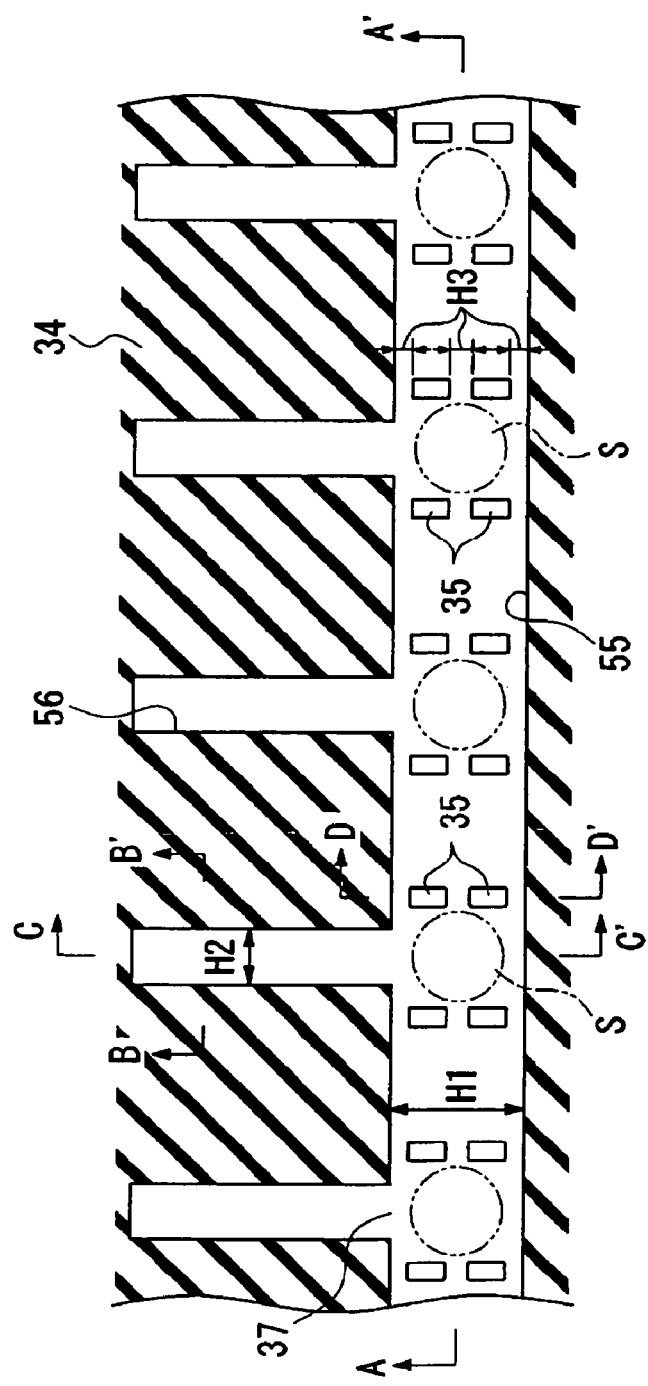
FIG. 3A is a schematic plane view of a bank structure and FIG. 3B is a sectional view of the bank structure.
Figure 3B:
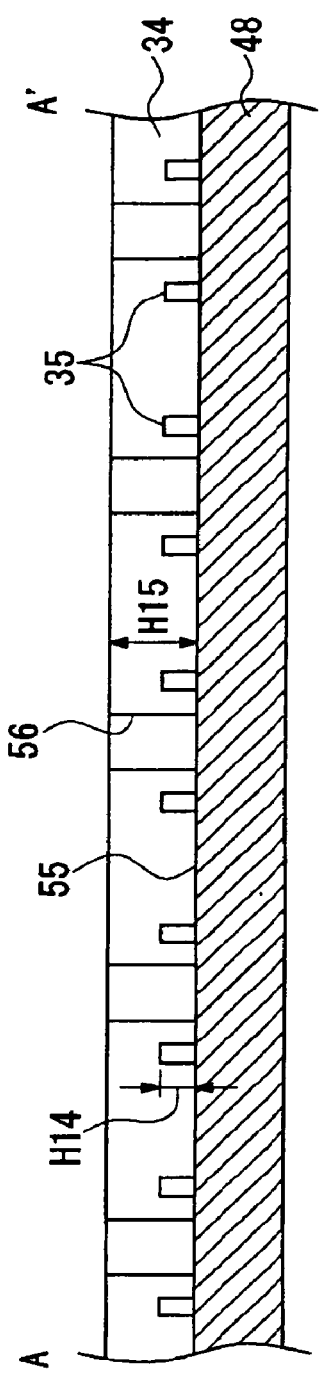

FIG. 3A is a schematic plane view of a bank structure and FIG. 3B is a sectional view of the bank structure.

As shown in FIG. 3, the bank structure in this embodiment consists of a bank 34 formed on a substrate 48 and a groove formed on the bank 34 corresponding to a predetermined wiring pattern.

The groove formed on the bank 34 corresponding to the predetermined wiring pattern includes a first groove part 55 and a second groove part 56. The first groove part 55 is formed so as to extend in the X-axis direction in FIG. 1 and has a width H1. The width H1 of the first groove part 55 here is equal to or larger than the in-flight diameter of the functional liquid discharged from the above-mentioned droplet discharge device IJ.

The second groove part 56 is coupled to the first groove part 55 in a substantially orthogonal direction and formed so as to extend in the Y-axis direction in FIG. 1. The second groove part 56 has a width H2 which is smaller than the width H1 of the first groove part 55. With such structure, the functional liquid L can flow into the second groove part 56 from the first groove part 55 by utilizing the capillary phenomenon.

Next, a structure of a convex portion 35 formed in the first groove part 55 in this embodiment is described with reference to FIGS. 3A and 3B. An entrance in second groove part 56 where the functional liquid flows in is hereinafter called a functional liquid influx gate 37.

As shown in FIGS. 3A and 3B, the convex portion 35 is provided on the bottom of the first groove part 55 in the plural number. Each convex portion 35 has a predetermined thickness (height) and a rectangular shape when it is viewed in plan. The convex portions are arranged on the bottom of the first groove part 55 according to a predetermined arrange pattern. More specifically, the convex portion 35 on the bottom of the first groove part 55 is formed so as to surround a region S provided on the bottom of the first groove part 55 as shown in FIG. 3A. The region S is where the first groove part 55 and the second groove part 56 is coupled, to be specific, it is the region where an axis that passes a midpoint of the width H2 of the second groove part 56 in the Y-axis direction and an axis that passes a midpoint of the width H1 of the first groove part 55 in the X-axis direction cross each other. In other words, the region S provided on the bottom of the first groove part 55 is placed so as to coaxially overlap the functional liquid influx gate 37 of the second groove part 56. Moreover, the region S is a hypothetical region provided on the bottom of the first groove part 55.

In a case where the region S is a circle when it is viewed in plan, the diameter of the circle is at least larger than the width H2 of the second groove part 56. This means that the diameter is substantially as large as or larger than the in-flight diameter of the functional liquid L. Thereby, the functional liquid L provided in the region S is surrounded by the convex portion 35. The convex portion 35 can temporary closes off the functional liquid L flowing into the first groove part 55, and then the temporary banked functional liquid L flows into the second groove part 56.

Next, the arrange pattern of the convex portion 35 is described.

The convex portion 35 is arranged in two lines in the Y-axis direction on the right side and the left side of the region S as shown in FIG. 3. The convex portion 35 placed on the left side of the region S and the other convex portion 35 placed on the right side of the region S are provided with a distance as long as the diameter of the region S therebetween. Each convex portion 35 has a rectangular shape and its longer side is placed in parallel with the Y-axis direction and its shorter side is placed in parallel with the X-axis direction. The convex portion 35 may also be arranged so as to slant, having a certain angle from the X-axis and the Y-axis.

An interval H3 between the two adjacent convex portions 35 in the Y-axis direction is smaller than the width H2 of the second groove part 56 as shown in FIG. 3A. Thereby, it is possible to make an internal pressure of the second groove part 56 smaller than an internal pressure of the two adjacent convex portions 35. Accordingly, the functional liquid L temporary banked on the bottom of the first groove part 55 can flow into the second groove part 56 where the internal pressure is low. Moreover, it is preferable that an interval between the convex portions 35 and the bank 34 is also smaller than the width H2 of the second groove part 56 in addition to the above-mentioned interval between the two adjacent convex portions 35.

The convex potion formed on the bottom of the first groove part 55 has a height H14 which is smaller than a height H15 of the bank 34 as shown in FIG. 3B. In this embodiment, a treatment to give a lyophobic quality is also performed to the upper surface of the bank 34. However, the convex potion 35 is formed by modifying a part of the bank 34, which is described later, and its upper surface is removed by a halftone exposure and development and the height of the convex potion 35 becomes lower than a partition wall. Thereby, the lyophobic quality is not given to the upper surface of the convex potion 35 and the functional liquid L can be provided on the upper surface of the convex potion 35. In this way, it is possible to increase the cross-sectional area of the pattern, decreasing the resistance of the pattern.

According to this embodiment, the plurality of the convex potions 35 and the bank 34 is formed so as to surround the region S as shown in FIG. 3A. Thereby, the functional liquid influx gate 37 of the second groove part 56 can be opened and the region S can be sectioned by the convex potions 35 and the bank 34. Therefore, when the functional liquid L is provided in the region S, the functional liquid L is dammed by the convex portion 35 and the bank 34. The dammed functional liquid L then flows toward the opened second groove part 56. In this way, the inflow of the functional liquid L into the second groove part 56 can be increased and this can equalize the film thickness of the wiring pattern formed in the first groove part 55 with the film thickness of the wiring pattern formed in the second groove part 56. Consequently, the upper surfaces of the functional liquid L disposed in the first groove part 55 and the second groove part 56 are leveled and this prevents the wiring and the like formed on the upper surface from being broken or short-circuited.

(Bank Structure and Pattern Forming Method)

FIG. 4 is a sectional view showing a forming process of a pattern and the bank structure. Left figures in FIG. 4 are sectional views along the line D-D' in FIG. 3 showing steps of forming a wiring pattern 40 in the first groove part 55. Middle figures in FIG. 4 are sectional views along the line B-B' in FIG. 3 showing steps of forming a wiring pattern 41 in the second groove part 56. Right figures in FIG. 4 are sectional views along the line C-C' in FIG. 3 showing the steps of forming the wiring patterns 40 and 41 in the first groove part 55 and the second groove part 56. FIGS. 5A and 5B are sectional views showing a forming method of the wiring pattern (Bank Material Applying Process)

Figure 4A:
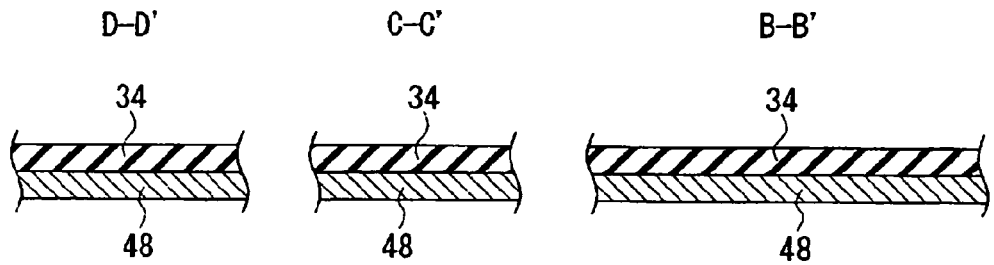
FIGS. 4A through 4D are sectional views showing a forming process of a wiring pattern.
Figure 5A:
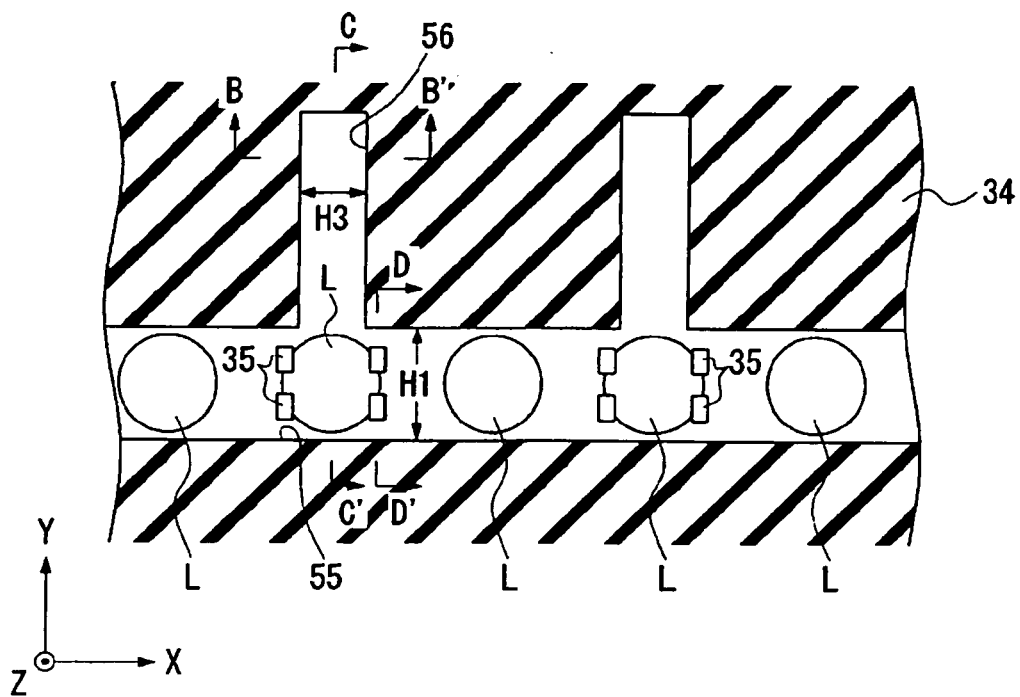
FIGS. 5A and 5B are sectional views showing a forming method of the wiring pattern.
Figure 5B:
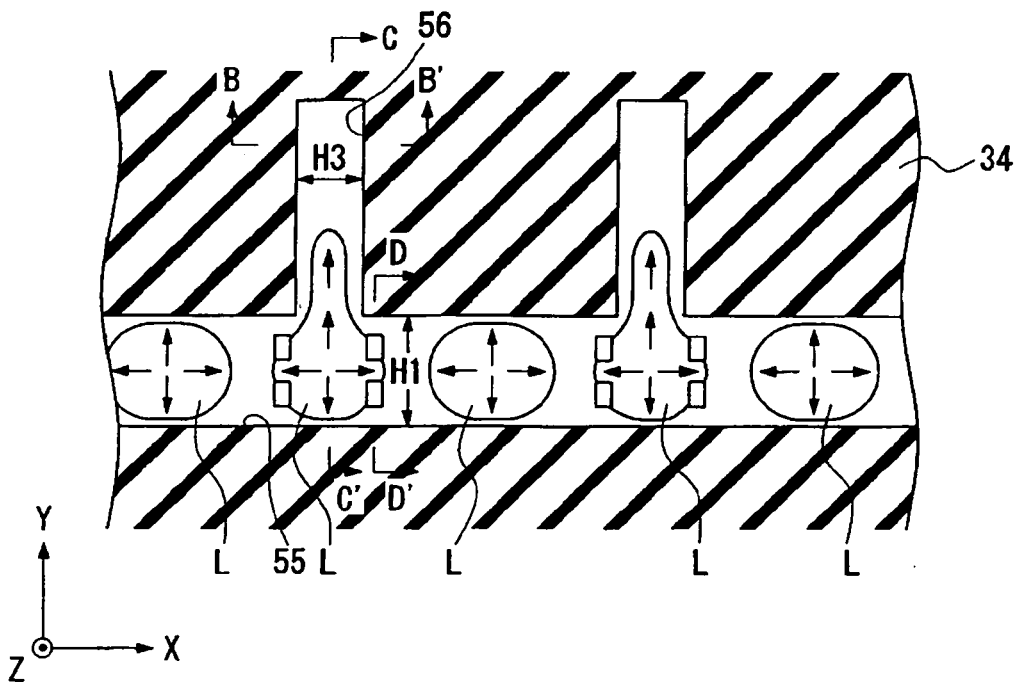

Firstly, a bank material is applied to the whole surface of the substrate 48 by a spin coat method as shown in FIG. 4A. The substrate 48 can be made of various materials such as glass, fused silica, Si wafer, plastic film, metal plate and the like. The bank material includes photosensitive acrylic resin or insulating material such as polyimide resin and lyophilic material. Therefore, the bank material can also serve as a resist so that a step of applying photoresist can be omitted. Furthermore, if a groove is formed in the bank material, the inner surface of the groove can be lyophilic in advance. It is also preferable that a foundation layer made of a semiconductor film, a metal film, a dielectric film, an organic film and the like is formed on the surface of the substrate 48. As for the method of applying the above-mentioned bank material, various methods such as spin coating, spray coating, roll coating, dye coating, dip coating and the like can be adopted.

(Lyophobic Treatment Process)

A plasma treatment using a fluorine-containing gas such as $CF_4$, $SF_6$, $CHF_3$ and the like is performed to the surface of the bank material applied on the whole surface of the substrate 48. This plasma treatment gives the lyophobic quality to the surface of the bank material. As a method of giving the lyophobic quality, for example, the plasma treatment ($CF_4$ plasma treatment) using tetrafluoromethane as a treatment gas in a room atmosphere can be adopted. Conditions of the $CF_4$ plasma treatment in this embodiment are set, for example, as follows: 50-1000 W of plasma power, 50-100 ml/min of tetrafluoromethane gas flow rate, 0.5-1020 mm/sec of substrate transport speed against a plasma discharge electrode, and 70-90° C. of the substrate temperature.

As the treatment gas, in addition to tetrafluoromethane, other fluorocarbon based gas can be used. It is also preferable that the above-mentioned lyophobic treatment is performed after a groove having a predetermined pattern is formed on the bank material as described later. In this case, a micro-contact-printing method may be employed. Furthermore, instead of performing such treatment, a lyophobic component (fluorine group and the like) may be filled in the bank material itself in advance. In this case, the $CF_4$ plasma treatment and the like dose not have to be performed.

Moreover, self-assembled monolayers (SAMs) in which compounds are oriented such that fluoroalkyl groups are positioned in the surface of the layer may be formed by using fluoroalkylsilane (FAS). In this way, the lyophobicity is also evenly given to the surface of the bank material.

As the chemical compounds that can form the SAMs, fluoroalkylsilanes (hereinafter called "FAS") such as heptadecafluoro-1,1,2,2 tetrahydrodecil-triethoxysilane, heptadecafluoro-1,1,2,2 tetrahydrodecil-trimethoxysilane, heptadecafluoro-1,1,2,2 tetrahydrodecil-trichlorosilane, heptadecafluoro-1,1,2,2 tetrahydrooctyl-triethoxysilane, heptadecafluoro-1,1,2,2 tetrahydrooctyl-trimethoxysilane, heptadecafluoro-1,1,2,2 tetrahydrooctyl-trichlorosilane and trifluoropropyltrimethoxysilane can be used. These compounds can be used alone or in combination. The SAMs made of organic molecular film and the like is formed on a substrate by providing the above-mentioned chemical compound and the substrate in a same hermetically-sealed container and leaving them in the room temperature for a few days. This is a forming method in vapor phase. The SAMs can also be formed by a forming method in liquid phase. For example, the SAMs can be formed on a substrate by immersing the substrate in a solution containing the compounds and then cleaning and drying the substrate.

Figure 4B:
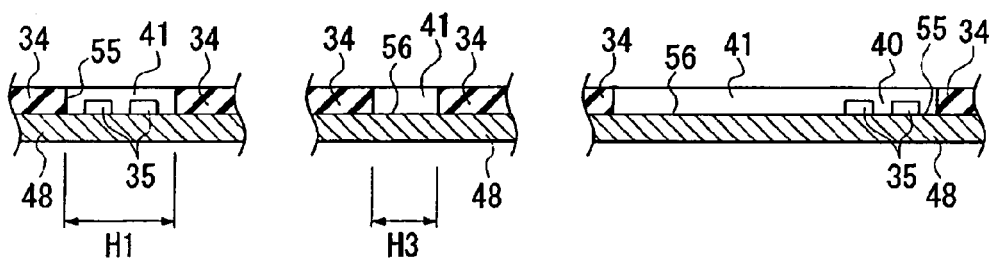

Next, the convex portions 35 are formed in the first groove part 55, the second groove part 56 and the bottom of the first groove part 55 by a photolithography using a halftone mask as shown in FIG. 4B. The halftone mask is a photomask having a blocking part that shuts off the exposure light from a photolithography machine, a transmitting part that completely transmits the exposure light and a partially-transmitting part that partially transmits the exposure light. A pattern of diffraction grating consists of a grid and the like is provided on the partially-transmitting part of the photomask so that the intensity of the exposure light that penetrates the mask can be controlled. As photochemical reaction used in the developing process in the following photolithography, a positive type resist is used.

The bank region that corresponds to the convex portion 35 formed on the bottom of the first groove part 55 is exposed by using the partially-transmitting transmitting photomask part of the halftone mask. More specifically, the partially-transmitting photomask part is aligned by using the region S which is hypothetically provided on the bottom of the first groove part 55 as a reference point, and then the exposure and development process is carried out. In this way, the exposure light that illuminates the bank region that corresponds to the convex portion 35 formed on the bottom of the first groove part 55 can be controlled and the bank material 34 can be less melted by the exposure.

The bank region that corresponds to the first groove part 55 and the second groove part 56 is simultaneously exposed by using the transmitting photomask part of the halftone mask which completely transmits the exposure light. Thereby, the region (bank material) corresponding to the first groove part 55 and the second groove part 56 is irradiated with the exposure light that is completely penetrated the mask.

Furthermore, a bank region other than the region corresponding to the first groove part 55 and the second groove part 56 is simultaneously exposed by using blocking part of the halftone mask which shuts off the exposure light. Thereby, the above-mentioned region is not irradiated with the exposure light and the bank 34 is not melted in the development process.

Subsequently, the development process is performed according to the above-described mask pattern. In the partially-transmitting photomask part, the convex portion 35 arranged on the bottom of the first groove part 55 in the above-described arrange pattern is formed. Here, the convex portions 35 are formed so as to make interval H3 between the two adjacent convex portions 35 in the Y-axis direction smaller than the width H2 of the second groove part 56. In this way, it is possible to make the internal pressure of the second groove part 56 smaller than the internal pressure of the two adjacent convex portions 35, as a result, the functional liquid L can flow into the second groove part 56 where the internal pressure is low. Furthermore, the bank 34 is exposed and developed such that the convex potion 35 formed on the bottom of the first groove part 55 has the height which is smaller than the height of the bank 34 as described above. In this way, the upper surface of the convex potion 35 where the lyophobic treatment is performed can be removed by the exposure and the development. In the way described above, the bank 34 is transformed into the plurality of the convex potions 35 by exposing and developing the bank 34.

Moreover, in the transmitting photomask part of the halftone mask which completely transmits the exposure light, the first groove part 55 having the width H1 and the second groove part 56 having the width H2 are formed. Here, the lyophilic quality is given to the surfaces of the first groove part 55, the second groove part 56 and the convex potion 35 since the bank material 34 is the lyophilic material as described above. An upper surface 34a of the first groove part 55 and the second groove part 56 has the lyophobic quality because the lyophobic treatment is performed as described above.

(Functional Liquid Disposing Process)

Figure 4C:
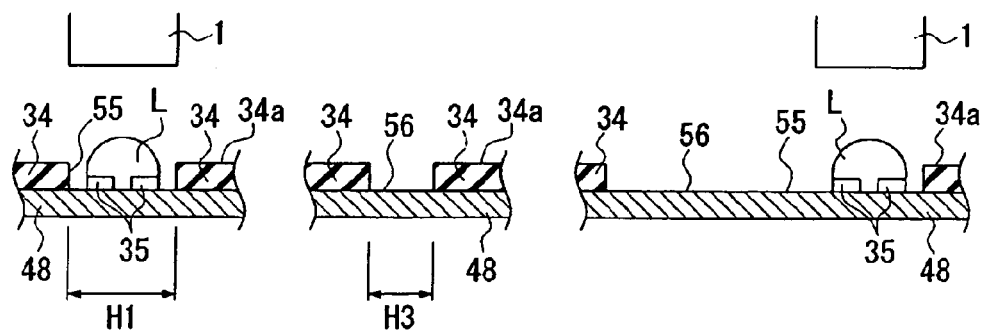

As shown in FIGS. 4C and 5A, the functional liquid L, which is the material used to form the wiring pattern, is disposed in the first groove part 55 by the droplet discharge device IJ. In this embodiment, the second groove part 56 in a second region is the fine wiring pattern. The width H3 of the second groove part 56 formed in the bank material 34 is so narrow that it is difficult to directly dispose the functional liquid L there by the droplet discharge device IJ. For this reason, the functional liquid L is disposed in the second groove part 56 by utilizing the capillary phenomenon, letting the functional liquid L provided in the first groove part 55 flow into the second groove part 56.

The functional liquid L provided in the first groove part 55 by the droplet discharge device IJ wetly spreads out in the first groove part 55 as shown in FIGS. 4C and 5A. Here, the functional liquid L is placed in the region including the region S provided on the bottom of the first groove part 55.

The functional liquid L provided in the first groove part 55 is temporary banked by the convex portion 35 formed in the first groove part 55 and the wall of the bank 34, and then the temporary banked functional liquid L flows toward the second groove part 56 where obstruction such as the convex portion is not formed. In this way, the capillary phenomenon which makes the functional liquid L flow into the second groove part 56 is promoted. Accordingly, the wiring pattern 40 (first pattern) is formed in the first groove part 55 and the wiring pattern 41 (second pattern) is formed in the second groove part 56.

Figure 4D:
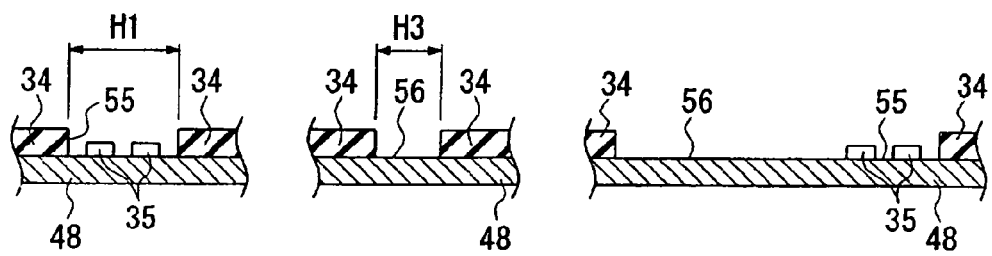

According to the embodiment, the plurality of the convex portions 35 is formed on the bottom of the first groove part 55. Thereby, the inflow of the functional liquid L into the second groove part 56 can be increased and this can equalize the film thickness of the first wiring pattern formed in the first groove part 55 with the film thickness of the second wiring pattern formed in the second groove part 56 as shown in FIG. 4D. Consequently, the upper surfaces of the functional liquid L disposed in the first groove part 55 and the second groove part 56 are leveled and this prevents the wiring and the like formed on the upper surface from being broken or short-circuited.

(Intermediate Drying Process)

After the functional liquid L is disposed in the first groove part 55 and the second groove part 56 and the wiring patterns 40 and 41 are formed, a drying Process is performed as necessary. By doing this, the dispersion medium of the functional liquid L is removed and the film thickness of the pattern can be ensured. The drying process may be performed by a commonly used heating method to heat the substrate 48, for example, a hot plate, an electric furnace, lamp annealing and the like. The light source of the lamp annealing is not particularly limited, though an infrared lamp, a xenon lamp, a YAG laser, an argon laser, a carbon dioxide gas laser, and excimer lasers such as XeF, XeCl, XeBr, KrF, KrCl, ArF and ArCl can be used as the light source. These light sources are generally used in an output range of above 10 W and below 5000 W. However one in a range of above 100 W and below 1000 W is sufficient for this embodiment. Furthermore, if necessary, the functional liquid disposing process may be repeatedly performed after the intermediate drying process in order to obtain a desired film thickness.

(Baking Process)

If a conductive material in the functional liquid L is, for example, the organic silver compound, it is necessary to remove the organic matter of the organic silver compound and make it to be a silver particle in order to obtain electrical conductivity. For this purpose, it is preferable that the substrate on which the functional liquid is disposed is treated with heat and/or light. The heat treatment and the light treatment are normally performed in the air. However, it may be performed in an inert gas atmosphere such as hydrogen, nitrogen, argon and helium. The temperature of the heat treatment and the light treatment is determined considering the boiling point (vapor pressure) of the dispersion medium, the kind and the pressure of the atmosphere gas, the thermal behavior such as the dispersibility or the oxidizability of the particles, the presence/absence of coatings, and the heat resistant temperature of the substrate.

For example, it is necessary to bake at a temperature of about 200° C. to remove the organic matter of the organic silver compound. In a case of a plastic substrate, it is preferably baked at a temperature ranging from room temperature to 100° C.

Through the above-described process, the silver particle which is the conductive material (organic silver compound) in the functional liquid L remains and the functional liquid L is transformed into the conductive film. Thereby, the conductive pattern as a continuous film, which is the wiring patterns 40 and 41, can be formed as shown in FIG. 4D.

Next, a pixel formed by utilizing the bank structure of the above-described embodiment and a method of forming the pixel are described with reference to FIGS. 6 though 8.

(Pixel Structure)

Figure 6:
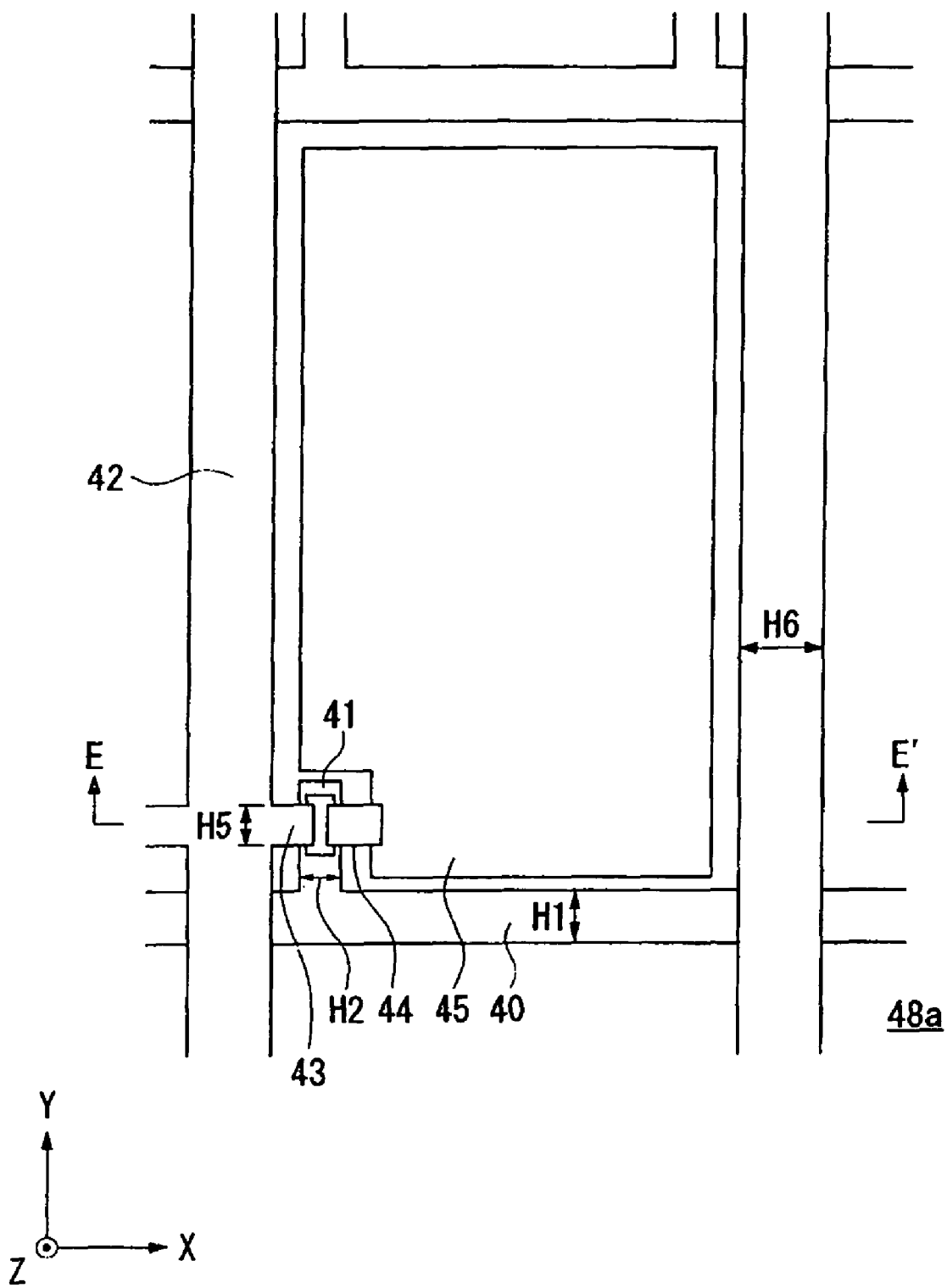
FIG. 6 is a schematic plan view of a pixel in a display region.

FIG. 6 shows a structure of the pixel according to this embodiment. The pixel includes a gate wiring 40 (the first pattern), a gate electrode 41 (the second pattern) which is formed so as to extend from the gate wiring 40, a source wiring 42 (the first pattern), a source electrode 43 (the second pattern) which is formed so as to extend from the source wiring 42, a drain electrode 44 and a pixel electrode 45 which is electrically coupled to the drain electrode 44. The gate wiring 40 is formed so as to extend in the X-axis direction and the source wiring 42 is formed so as to extend in the Y axis direction, crossing the gate wiring 40. Thin film transistor (TFT), which is a switching element, is formed near the intersection of the gate wiring 40 and the source wiring 42. Drive current is supplied to the pixel electrode 45 that is electrically coupled to the TFT by switching the TFT into ON state.

Here, as shown in FIG. 6, the width H2 of the gate electrode 41 is smaller than the width H1 of the gate wiring 40. For example, the width H2 of the gate electrode 41 is 10 μm and the width H1 of the gate wiring 40 is 20 μm. Moreover, the width H5 of the source electrode 43 is smaller than the width H6 of the source wiring 42. For example, the width H5 of the source electrode 43 is 10 μm and the width H6 of the source wiring 42 is 20 μm. By forming the wirings and the electrodes in this way, the functional liquid L can flow into the fine pattern with the capillary phenomenon even if the fine pattern (the gate electrode 41 and the source electrode 43) is so narrow that the functional liquid L cannot be directly discharged.

(Method of Forming Pixel)

FIGS. 7A through 7E are sectional views along the line E-E' in FIG. 6 showing a forming process of the pixel.

In this embodiment, the pixel including the gate electrode, the source electrode and the drain electrode of a bottom gate type TFT 30 is formed by using the above-mentioned method of forming the bank structure and the pattern. The same processes as the above-described pattern forming processes shown in FIGS. 4A though 4D and FIGS. 5A and 5B will be performed in the following description. Therefore, the description of these processes will be omitted. Furthermore, the pattern 41 formed in the above-described process is referred as the gate electrode in the following description of the method of forming the pixel. The identical numerals are given to the same structures and elements as those of the above-described embodiment are given.

Figure 7A:
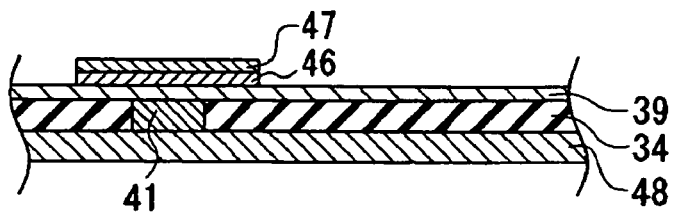
FIGS. 7A through 7E are sectional views showing a forming process of the pixel.

As shown in FIG. 7A, a gate insulating film 39 is formed on a flat face of the bank including the wiring patterns formed in the processes shown in FIGS. 4A through 4D by a plasma chemical vapor deposition (CVD) method and the like. Here, silicon nitride is used for the gate insulating film 39. Subsequently, an active film is formed on the gate insulating film 39. Then, an amorphous silicon film 46 is patterned so as to have a predetermined shape by photolithography and etching as shown in FIG. 7A.

Next, a contact layer 47 is formed on the amorphous silicon film 46. Subsequently, the patterning to form a predetermined pattern is performed by the photolithography and the etching as shown in FIG. 7A. The contact layer 47 is formed by using an n+ type silicon film and changing the material gas and the plasma conditions.

Next, as shown in FIG. 6B, the bank material is applied on the whole surface including the surface of the contact layer 47 by the spin coating. The bank should be optically transparent and lyophobic. Therefore, as the bank material, polymeric materials such as acrylic resin, polyimide resin, olefin resin, and melamine resin can be suitably used. More preferably, polysilazane having an inorganic structure is used in terms of heat resistance and transmissivity. In order to give the lyophobic quality to the bank material, the CF4 plasma treatment (plasma treatment using a gas containing a fluorine component) is performed. Instead of performing such treatment, the lyophobic component (fluorine group and the like) may be preferably filled in the bank material itself in advance. In this case, the $CF_4$ plasma treatment and the like dose not have to be performed. It is preferable to ensure that the contact angle of the functional liquid L with respect to the bank material made to be lyophobic in the above-described manner is above 40°.

Next, a source/drain electrode bank 34b whose size is ⅟₂₀ to ⅟₁₀ of the one pixel is formed. More specifically, a source electrode groove part 43a is formed at a position corresponding to the source electrode 43 in the bank material 34 applied on the upper surface of the gate insulating film 39 by the photolithography process. A drain electrode groove part 44a is also formed at a position corresponding to the drain electrode 44. At the same time, the plurality of the convex portions 35 having the predetermined arrange pattern is formed in a source wiring groove part (not shown in the figures) in the same manner as the ones on the bottom of the gate wiring groove part 55.

Next, the functional liquid L is disposed in the source electrode groove part 43a and the drain electrode groove part 44a formed in the source/drain electrode bank 34b so as to form the source electrode 43 and the drain electrode 44. To be more specific, firstly, the functional liquid L is disposed in the source wiring groove part by the droplet discharge device IJ (not shown in the figures). The width H5 of the source electrode 43 is smaller than the width H6 of the source wiring 42 as shown in FIG. 6. Thereby, the convex portion temporary closes off the functional liquid L provided in the source wiring groove part, and then the temporary banked functional liquid L flows into the source electrode groove part 43a by the capillary phenomenon. In this way, the source electrode 43 is formed as shown in FIG. 7C. In the same manner, the drain electrode 44 is also formed.

Next, the source/drain electrode bank 34b is removed after the source electrode 43 and the drain electrode 44 are formed as shown in FIG. 7C. Subsequently, the N+ silicon film of the contact layer 47 formed between the source electrode 43 and the drain electrode 44 is etched by using the source electrode 43 and the drain electrode 44 remained on the contact layer 47 as a mask. By this etching process, the N+ silicon film of the contact layer 47 formed between the source electrode 43 and the drain electrode 44 is removed and a part of the amorphous silicon film 46 formed under the N+ silicon film is exposed. In this way, a source region 32 made of the N+ silicon is formed under the source electrode 43 and a drain region 33 made of the N+ silicon is formed under the drain electrode 44. Furthermore, a channel region made of the amorphous silicon (amorphous silicon film 46) is formed under the source region 32 and the drain region 33.

The bottom gate type TFT 30 is formed by the above-described process.

With the pattern forming method according to the embodiment, the film thickness of the source wiring 42 can be leveled with the film thickness of the source electrode 43 and the upper surfaces of these regions can also be leveled. Consequently, even when a predetermined pattern is further formed on the leveled region, pattern braking, short-circuited and the like caused by the step can be prevented. Moreover, the lyophobic treatment is performed to the upper surface of the source/drain electrode bank 34b and the inner surfaces of the above-mentioned source electrode groove part 43a and the drain electrode groove part 44a are lyophilic. Therefore, the functional liquid L will not flow out the groove and the fine wiring pattern can be formed.

Figure 7B:
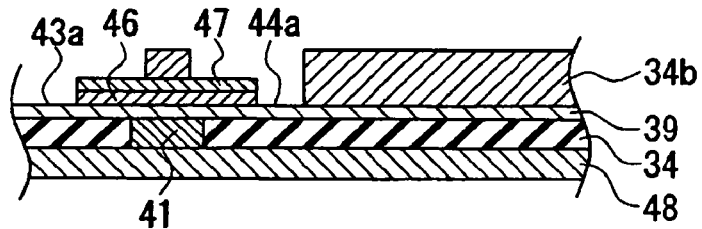
Figure 7C:
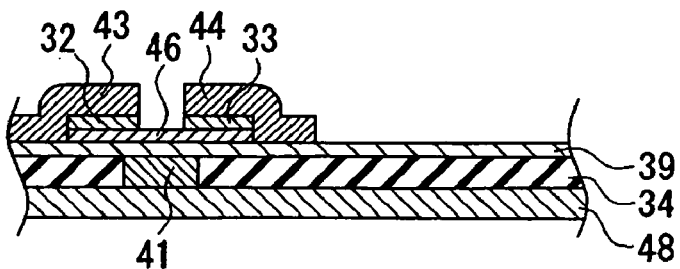
Figure 7D:
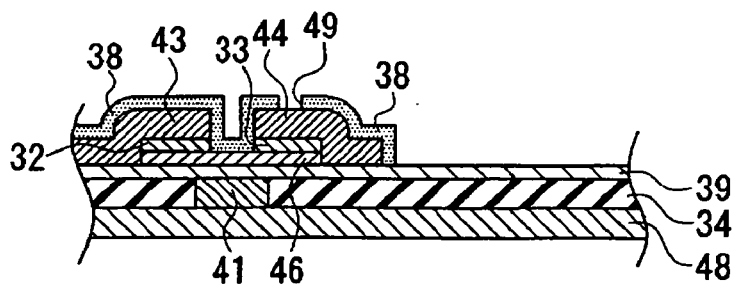

Next, as shown in FIG. 7B, a passivation film 38 (protection film) is formed on the source electrode 43, the drain electrode 44, the source region 32, the drain region 33 and the exposed silicon layer by deposition or spattering and the like. Subsequently, the passivation film 38 positioned on the gate insulating film 39 where the after-mentioned pixel electrode 45 is formed is removed by the photolithography and the etching. At the same time, a contact hole 49 is formed in the passivation film 38 that is on the drain electrode 44 in order to electrically couple the pixel electrode 45 and the source electrode 43.

Figure 7E:
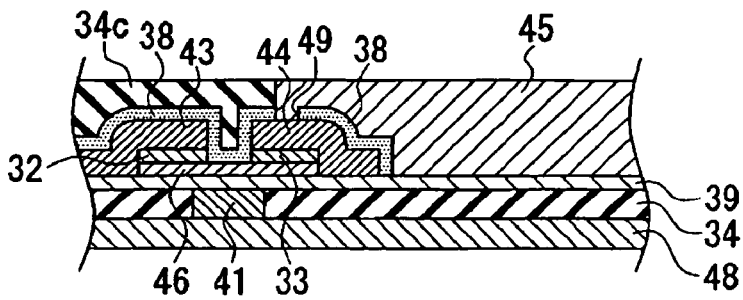

Next, as shown in FIG. 7E, the bank material is applied on the region including the gate insulating film 39 where the after-mentioned pixel electrode 45 is formed. Here, the bank material includes, for example, the acrylic resin, the polyimide resin and the polysilazane as described above. Subsequently, the lyophobic quality is given to the upper surface of the bank material (pixel electrode bank 34c) by the plasma treatment and the like. Then, a pixel electrode groove part is formed in the region where the pixel electrode 45 is formed by the photolithography and the pixel electrode bank 34c is formed.

Next, the pixel electrode 45 made of indium tin oxide (ITO) is formed in the region sectioned by the pixel electrode bank 34c by the ink-jet method or the deposition and the like. The electric connection between the pixel electrode 45 and the drain electrode 44 is secured by filling the pixel electrode 45 into the contact hole 49. In this embodiment, the lyophobic treatment is performed to the upper surface of the pixel electrode bank 34c and the lyophilic treatment is performed to the pixel electrode groove part. Therefore, the pixel electrode 45 can be formed without protruding from the pixel electrode groove part.

Through above-described process, the pixel electrode of the embodiment as shown in FIG. 6 can be formed.

Second Embodiment

In this embodiment, a different arrange pattern of the convex portion formed on the bottom of the first groove part 55, which is different from that of the first embodiment, will be described. Other basic structures including the bank structure and the pattern forming method are the same as those of the first embodiment. Therefore, the identical numerals are given to them and those detailed descriptions will be omitted.

FIGS. 8A and 8B show an arrange pattern of the convex portion formed on the bottom of the first groove part 55.

As shown in FIGS. 8A and 8B, the convex portion 35 is provided on the bottom of the first groove part 55 in the plural number. Each convex portion 35 has a rectangular shape when it is viewed in plan. The convex portions are arranged on the bottom of the first groove part 55 according to a predetermined arrange pattern. More specifically, the convex portions 35 on the bottom of the first groove part 55 are arranged in three lines on the right and left side of the region S in the Y-axis direction as shown in FIGS. 8A and 8B. In other words, the convex portions 35 is arranged so as to surround the region S in two rows and three columns on the bottom of the first groove part 55.

Each convex portion 35 has a longer side of the rectangular shape which is placed in parallel with the X-axis direction and a shorter side placed in parallel with the Y-axis direction. Moreover, the interval H6 between the two adjacent convex portions 35 in the Y-axis is smaller than the width H5 of the second groove part 56 as shown in FIG. 8A in the same way as the above-described first embodiment. Furthermore, it is preferable that the convex potion 35 formed on the bottom of the first groove part 55 has the height which is smaller than the height of the bank 34 as shown in FIG. 8B.

According to this embodiment, unlike the above-described first embodiment, the longer side of the convex portion 35 can be made to be longer compared with the first embodiment and the longer side distance of the space between the two adjacent convex portions 35 in the Y-axis direction can also be made to be longer than that of the first embodiment. Thereby, the resistance (internal pressure) between the two adjacent convex portions 35 is increased and the functional liquid L can smoothly flow into the second groove part 56 where the resistance (internal pressure) is relatively low compared with that of the two adjacent convex portions 35. Note that this embodiment has the same advantageous effect as that of the first embodiment.

Third Embodiment

In this embodiment, a different arrange pattern of the convex portion formed on the bottom of the first groove part 55, which is different from those of the first embodiment and the second embodiment, will be described. Other basic structures including the bank structure and the pattern forming method are the same as those of the first embodiment. Therefore, the identical numerals are given to them and those detailed descriptions will be omitted.

FIGS. 9A and 9B show an arrange pattern of the convex portion formed on the bottom of the first groove part 55.

As shown in FIGS. 9A and 9B, the convex portion 35 is provided on the bottom of the first groove part 55 in the plural number. Each convex portion 35 has the rectangular shape when it is viewed in plan. The convex portions are arranged on the bottom of the first groove part 55 according to a predetermined arrange pattern. More specifically, the convex portions 35 on the bottom of the first groove part 55 are arranged in two lines on the right and left side of the region S in the Y-axis direction as shown in FIGS. 9A and 9B. In addition, other convex portion 35 is provided between the lower side of the region S in plan and the opposed bank 34. In other words, the convex portions 35 is formed n the bottom of the first groove part 55 so as to surround the region S.

Each convex portion 35 has the longer side of the rectangular shape which is placed in parallel with the X-axis direction and the shorter side placed in parallel with the Y-axis direction. Moreover, the interval H6 between the two adjacent convex portions 35 in the Y-axis is smaller than the width H5 of the second groove part 56 as shown in FIG. 9A in the same way as the above-described first embodiment. Furthermore, it is preferable that the convex potion 35 formed on the bottom of the first groove part 55 has the height which is smaller than the height of the bank 34 as shown in FIG. 9B.

According to this embodiment, even if the in-flight diameter of the provided functional liquid L is smaller than that of the first embodiment or the second embodiment, it is possible to credibly dam the functional liquid L. Also note that this embodiment has the same advantageous effect as that of the first embodiment.

Forth Embodiment

In this embodiment, a different arrange pattern of the convex portion formed on the bottom of the first groove part 55, which is different from those of the first embodiment and the second embodiment, will be described. Other basic structures including the bank structure and the pattern forming method are the same as those of the first embodiment. Therefore, the identical numerals are given to them and those detailed descriptions will be omitted.

FIGS. 10A and 10B show an arrange pattern of the convex portion formed on the bottom of the first groove part 55.

As shown in FIGS. 10A and 10B, the convex portion 35 is provided on the bottom of the first groove part 55 in the plural number. Each convex portion 35 has the rectangular shape when it is viewed in plan. The convex portions are arranged on the bottom of the first groove part 55 according to a predetermined arrange pattern. More specifically, the convex portions 35 on the bottom of the first groove part 55 are arranged in three lines in the Y-axis direction with a predetermined interval H12 therebetween and these convex portions 35 in the three lines are also arranged in the X-axis direction with a predetermined interval H13 therebetween as shown in FIGS. 10A and 10B. In other words, these convex portions 35 are formed so as to arrange in a staircase pattern. These convex portions 35 arranged in the predetermined arrange pattern are respectively provided on the left and right side of each region S.

Each convex portion 35 has two opposing sides of the rectangular shape which are placed in parallel with the X-axis direction and the other two opposing sides which are placed in parallel with the Y-axis direction. Moreover, the interval H6 between the two adjacent convex portions 35 in the Y-axis is smaller than the width H5 of the second groove part 56 as shown in FIG. 10A in the same way as the above-described first embodiment. Furthermore, it is preferable that the convex potion 35 formed on the bottom of the first groove part 55 has the height which is smaller than the height of the bank 34 as shown in FIG. 10B.

According to this embodiment, even when the convex portions 35 are formed so as to displace in the above-described way, the same advantageous effect as that of the first embodiment can be obtained.

(Electrooptical Device)

Next is a description of a liquid crystal display which is an example of the electro-optical device of the invention.

Figure 11:
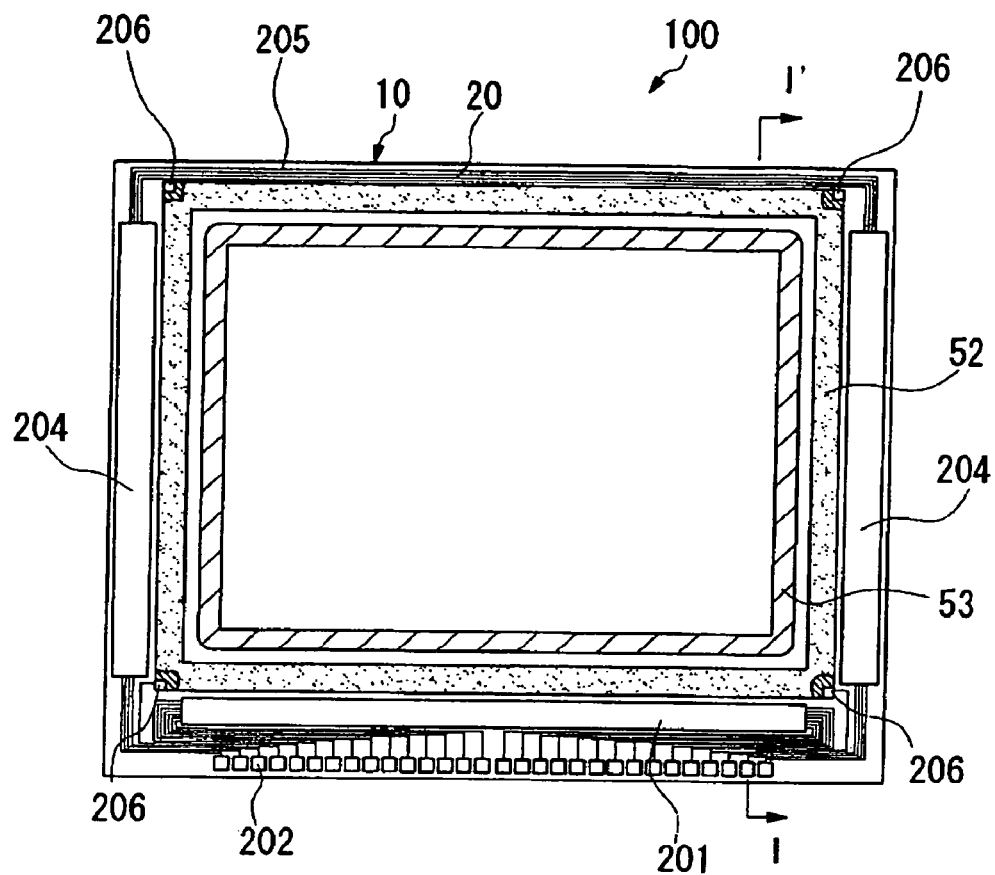
FIG. 11 is a plan view of a liquid crystal display viewed from the side of a facing substrate.
Figure 12:
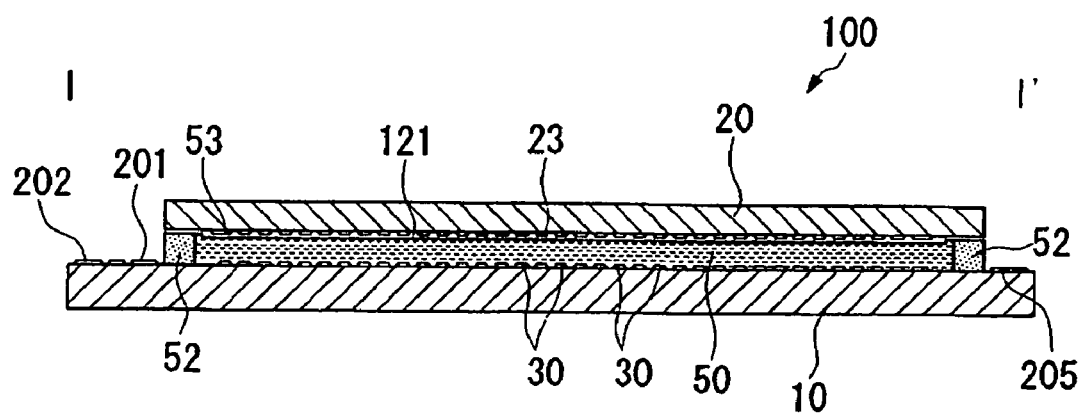
FIG. 12 is a sectional view along the line H-H' in FIG. 9.
Figure 13:
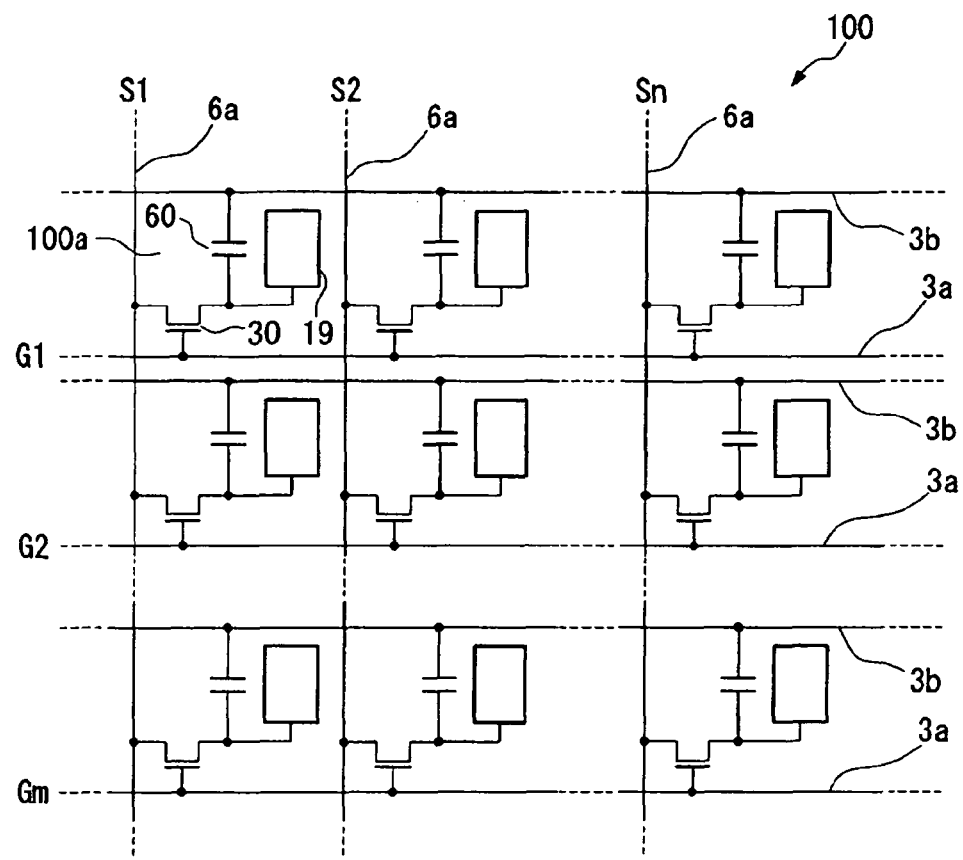
FIG. 13 is an equivalent circuit diagram of the liquid crystal display.

FIG. 11 is a plan view of a liquid crystal display and the respective components according to the present invention, viewed from the facing substrate side. FIG. 12 is a sectional view taken along a line H-H' of FIG. 11. FIG. 13 is an equivalent circuit diagram of various kinds of elements, wiring, and the like in a plurality of pixels formed in a matrix in an image display region of the liquid crystal display. In the respective drawings used in the description hereunder, the degree of reduction may differ depending on respective layers and respective members, so as to make them into a recognizable size.

In FIG. 11 and FIG. 12, a liquid crystal display (electro-optical device) 100 of the embodiment includes a TFT array substrate 10 and a facing substrate 20 which form a pair with each other, and which are adhered by a sealing material 52 being a photocurable sealing material. A liquid crystal 50 is filled into and retained in a region sectioned by this sealing material 52. The sealing material 52 is formed in a closed frame shape in a region within the substrate surface, and is of a construction with no liquid crystal inlet nor traces of its sealing by a sealing material.

In a region inside of the region formed by the sealing material 52, a peripheral parting 53 being a shading material is formed. Outside of the sealing material 52, a data line driving circuit 201 and mounting terminals 202 are formed along one side of the TFT array substrate 10, and scanning line driving circuits 204 are formed along the two sides adjacent to this side. On the remaining one side of the TFT array substrate 10, a plurality of wirings 205 are provided for connecting between the scanning line driving circuits 204 provided on both sides of the image display region. Moreover, on at lease one section of the corners of the facing substrate 20, intra-substrate conductive materials 206 are provided and disposed for electrically connecting between the TFT array substrate 10 and the facing substrate 20.

Instead of forming the data line driving circuit 201 and the scanning line driving circuits 204 on the TFT array substrate 10, for example, a TAB (Tape Automated Bonding) substrate mounted with a driving LSI, and a terminal group formed at the periphery of the TFT array substrate 10, may be electrically and mechanically connected via an anisotropic conductive film. On the liquid crystal display 100, a phase contrast plate, a polarizing plate, or the like is disposed in a predetermined direction according to the kind of liquid crystal 50 to be used, that is, according to the operation mode such as TN (Twisted Nematic) mode, C-TN method, VA method, IPS method, or normal white mode/normal black mode, however this is not shown here.

Moreover, in the case where the liquid crystal display 100 is constituted for use as a color display, then on the facing substrate 20, for example, color filters of red (R), green (G), and blue (B) are formed with their protective films, in the regions facing the respective pixel electrodes of the TFT array substrate 10, described later.

In the image display region of the liquid crystal display 100 having such a construction, as shown in FIG. 10, a plurality of pixels 100a are configured in a matrix form, TFTs (switching elements) 30 for pixel switching are formed in these respective pixels 100a, and data lines 6a which supply pixel signals S1, S2, to Sn, are electrically connected to the sources of the TFTs 30. The pixel signals S1, S2, to Sn, for writing to the data lines 6a may be line-sequential supplied in this order, or may be supplied to each group with respect to adjacent pairs of data lines 6a. Moreover, the configuration is such that the scanning lines 3a are electrically connected to the gates of the TFTs 30, and scanning signals G1, G2, to Gm are applied pulsewise to the scanning lines 3a, in this line-sequential order at a predetermined timing.

The pixel electrodes 19 are electrically coupled to the drains of the TFTs 30 so as to power ON the TFTs 30 which are the switching elements, only in a fixed period so that the pixel signals S1, S2, to Sn supplied from the data lines 6a can be written into the respective pixels at a predetermined timing. In this manner, the pixel signals S1, S2, to Sn of the predetermined level written into the liquid crystal through the pixel electrodes 19 are retained for a fixed period between counter electrodes 121 of the facing substrate 20 shown in FIG. 12. In order to prevent leakage of the retained pixel signals S1, S2, to Sn, storage capacitances 60 are added in parallel to the liquid crystal capacitances formed between the pixel electrodes 19 and the counter electrodes 121. For example, the voltage of the pixel electrodes 19 is retained by the storage capacitances 60 for a time which is thousands of times longer than the time for which the source voltage is applied. Consequently, the retention property of the electric charge can be improved so as to realize a liquid crystal display 100 having a high contrast ratio.

Figure 14:
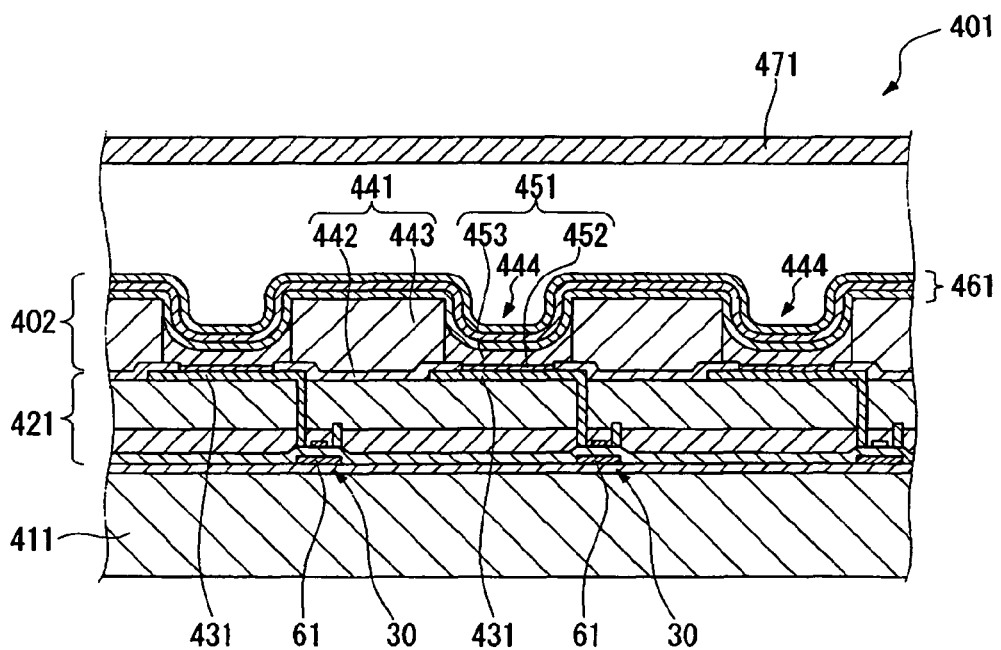
FIG. 14 is an enlarged partial sectional view of an organic electroluminescence (EL) device.

FIG. 14 is a sectional side view of an organic electroluminescence (EL) device having the pixel electrode formed by the above-described bank structure and the pattern forming method. A general configuration of the organic EL device is described with reference to FIG. 14.

In FIG. 14, an organic EL device 401 is an organic EL element 402 having a substrate 411, a circuit element section 421, pixel electrodes 431, bank sections 441, light emission elements 451, a negative electrode 461 (counter electrode) and a sealing substrate 471 and a wiring of a flexible substrate (not shown) and a driving IC (not shown) is coupled to the organic EL element 402. The circuit element section 421 is an active element TFT 60 formed on the substrate 411, having a configuration such that a plurality of pixel electrodes 431 is arranged on the circuit element section 421. Moreover, a gate wiring 61 composing the TFT 60 is formed by the wiring pattern forming method of the above embodiment.

Between the respective pixel electrodes 431, the bank sections 441 are formed in grid form. In a crevice opening 444 produced by the bank sections 441, a light emission element 451 is formed. The light emission element 451 is composed of an element which emits red fluorescence, an element which emits green fluorescence, and an element which emits blue fluorescence. Therefore the organic EL device 401 can display in full colors. The negative electrode 461 is formed over the whole top surface of the bank sections 441 and the light emission elements 451. On the negative electrode 461, the sealing substrate 471 is laminated.

The manufacturing process of the organic EL device 401 including the organic EL element includes; a bank section forming step for forming the bank sections 441, a plasma treatment step for appropriately forming the light emission elements 451, a light emission element forming step for forming the light emission elements 451, a counter electrode forming step for forming the negative electrode 461, and a sealing step for laminating the sealing substrate 471 onto the negative electrode 461 so as to seal it.

The light emission element forming step is one where on a crevice opening 444, that is a pixel electrode 431, an electron holes injecting layer 452 and a fluorescent layer 453 are formed so as to form a light emission element 451, and includes an electron holes injecting layer forming step and a fluorescent layer forming step. The electron holes injecting layer forming step includes a first discharging step for discharging a liquid material for forming the electron holes injecting layer 452 onto the respective pixel electrode 431, and a first drying step for drying the discharged liquid material so as to form the electron holes injecting layer 452. Moreover, the fluorescent layer forming step includes a second discharging step for discharging a liquid material for forming the fluorescent layer 453 onto the electron holes injecting layer 452, and a second drying step for drying the discharged liquid material so as to form the fluorescent layer 453. As described above, the fluorescent layer 453 is composed of three kinds formed by materials corresponding to the three colors of red, green and blue. Therefore, the second discharging step includes three steps for respectively discharging the three kinds of materials.

In this light emission element forming step, the droplet discharge device IJ may be used at the first discharging step in the electron holes injecting layer forming step, and at the second discharging step in the fluorescent layer forming step.

The device (electro-optical device) according to the invention is also applicable, in addition to the above-mentioned devices, to a plasma display panel (PDP) and a surface-conduction-type electron emission element or the like which utilizes a phenomenon where current flows in parallel with the surface of a small sized thin film formed on a substrate so as to cause electron emission.

(Electronic Equipment)

Next, specific examples of electronic equipment of the present invention are described.

Figure 15:
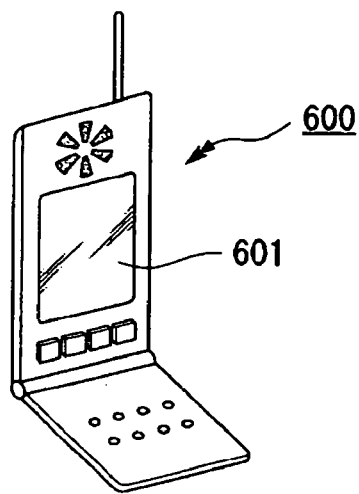
FIG. 15 shows a specific example of electronic equipment according to the invention.

FIG. 15 is a perspective view showing an example of a cellular phone. In FIG. 15, reference number 600 denotes a main body of the cellular phone and reference number 601 denotes a liquid crystal display part having the liquid crystal display in the above-described embodiments.

The electronic equipment shown in FIG. 15 is equipped with the liquid crystal display formed by the method of forming the pattern having the bank structure described in the above embodiments so that a high quality and performance can be obtained.

Though the electronic equipment in this embodiment has the liquid crystal device, the electronic equipment may be equipped with other electrooptical device such as an organic electroluminescence display device, a plasma display device and the like.

Next, an example in which the pattern formed by the method of forming the pattern having the bank structure according to the invention is applied to an antenna circuit is described.

Figure 16:
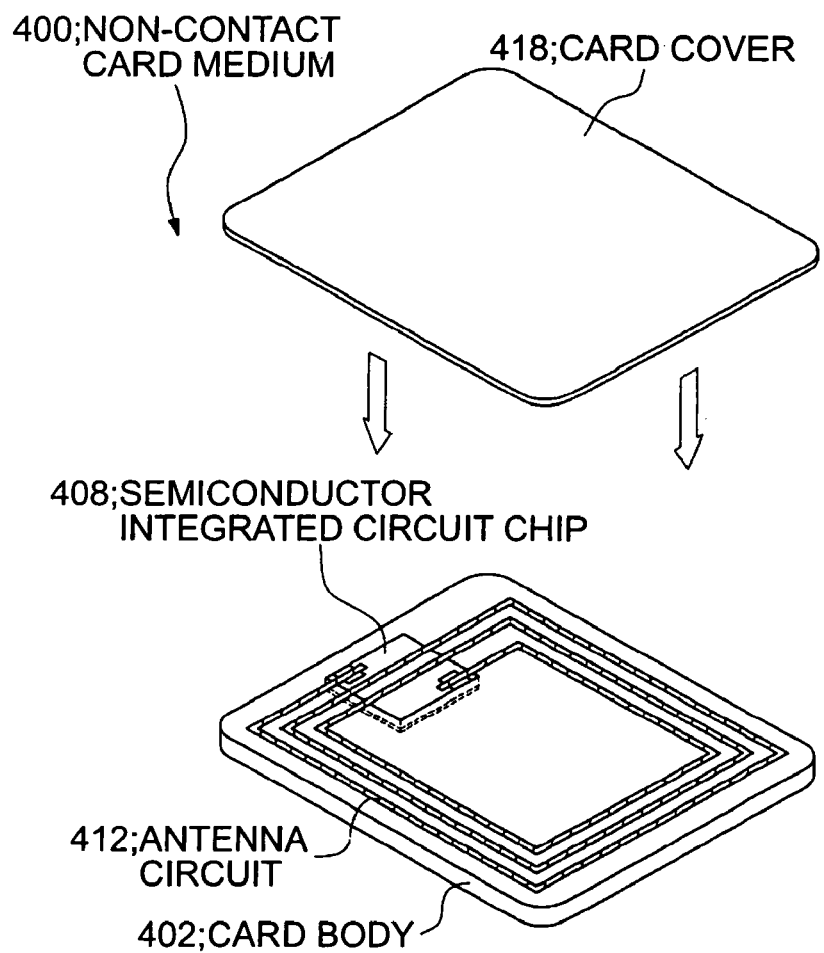
FIG. 16 is an exploded perspective view of a non-contact card medium.

FIG. 16 shows a non-contact card medium according to the embodiment. The non-contact card medium 400 has a semiconductor integrated circuit chip 408 and an antenna circuit 412 built in a case consists of a card body 402 and card cover 418. The non-contact card medium 400 performs at least power supply or/and data transfer with an external transmitter (not shown) through at least electromagnetic waves or/and electric capacitance coupling.

In the present embodiment, the antenna circuit 412 is formed according to the pattern forming method of the invention. Therefore, the antenna circuit 412 can be made finer with thinner lines so that high quality and performance can be obtained.

The invention may be applied to other electronic equipment in addition to the above-mentioned electronic equipment. For example, The invention can be applied to a liquid crystal projector, a personal computer (PC) compatible with multimedia, an engineering work station (EWS), a pager, a word processor, TV, a view finder type or direct view type video tape recorder, an electronic databook, a calculator, a car navigation device, a point-of-sale (POS) terminal, equipments having a touch panel and the like.

Although the embodiments of the invention have been fully described by way of example with reference to the accompanying drawings, it is to be understood that the embodiments described hereunder do not in any way limit the scope of the invention but various changes and modifications will be applied within the scope and spirit of the present invention.

In the above-described embodiments, a desired groove part (for example, the first groove part and the like) is formed on the bank by the photolithography process or the etching process. For example, the desired groove part may be formed by patterning the bank by using a laser instead of the above-mentioned forming method.

Furthermore, though the convex portion is formed in the rectangular shape when it is viewed in plan, the convex portion may be formed in circle or polygon shape when it is viewed in plan.

What is claimed is:

1. A partition-wall structure having a concave portions corresponding to a pattern formed by a functional liquid, comprising:

a first concave portion provided corresponding to a first pattern;

a second concave portion provided corresponding to a second pattern that is coupled to the first pattern and whose width is smaller than a width of the first pattern; and a convex portion provided in and on a bottom region of the first concave portion;

wherein the concave and convex portions correspond to the pattern formed by the functional liquid.

2. The partition-wall structure according to claim 1, wherein the convex portion is provided on a bottom region of the first concave portion including a coupling region of the first concave portion and the second concave portion.

3. The partition-wall structure according to claim 1, wherein the convex portion includes a plurality of convex portions and an interval between the adjacent convex portions is smaller than the width of the second pattern.

4. The partition-wall structure according to claim 1, wherein a height of the convex portion is smaller than a height of an upper surface of the partition-wall structure.

5. The partition-wall structure according to claim 1, wherein the convex portion is provided along a longer side of the second pattern.

6. A device, comprising:

the partition-wall structure according to claim 1; and a pattern placed in the first concave portion and the second concave portion.

7. The device according to claim 6, wherein the first pattern is a gate wiring and the second pattern is a gate electrode.

8. The device according to claim 6, wherein the first pattern is a source wiring and the second pattern is a source electrode.

9. An electrooptical device, comprising the device according to claim 8.

10. Electronic equipment, comprising the electrooptical device according to claim 9.

* * * * *

UNITED STATES PATENT AND TRADEMARK OFFICE
CERTIFICATE OF CORRECTION

| | |
|---|---|
| PATENT NO. | : 7,732,817 B2 |
| APPLICATION NO. | : 11/213789 |
| DATED | : June 8, 2010 |
| INVENTOR(S) | : Toshimitsu Hirai et al. |

It is certified that error appears in the above-identified patent and that said Letters Patent is hereby corrected as shown below:

Title page add the Foreign Application Priority Data as shown below:

Item (30)     Foreign Application Priority Data

September 30, 2004 (JP)..........................2004-288696

Signed and Sealed this

Seventeenth Day of August, 2010

David J. Kappos
*Director of the United States Patent and Trademark Office*